US008110337B2

(12) United States Patent
Shimada

(10) Patent No.: US 8,110,337 B2
(45) Date of Patent: Feb. 7, 2012

(54) POLYMERIZABLE COMPOSITION AND LITHOGRAPHIC PRINTING PLATE PRECURSOR

(75) Inventor: Kazuto Shimada, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/738,305

(22) Filed: Dec. 18, 2003

(65) Prior Publication Data
US 2004/0137369 A1    Jul. 15, 2004

(51) Int. Cl.
G03F 7/029 (2006.01)
G03F 7/032 (2006.01)
G03F 7/031 (2006.01)
G03F 7/09 (2006.01)

(52) U.S. Cl. ............... 430/271.1; 430/281.1; 430/285.1; 430/302; 430/905; 430/921; 430/925; 430/944

(58) Field of Classification Search ............... 430/281.1, 430/285.1, 921, 944, 910, 905, 271.1, 302
See application file for complete search history.

(56) References Cited

U.S. PATENT DOCUMENTS

| | | | |
|---|---|---|---|
| 3,725,356 A | 4/1973 | Lüders et al. | |
| 3,804,631 A | 4/1974 | Faust | |
| 3,839,171 A | 10/1974 | Akamatsu et al. | |
| 3,930,865 A | 1/1976 | Faust et al. | |
| 4,019,972 A | 4/1977 | Faust | |
| 4,239,849 A | 12/1980 | Lipson et al. | |
| 4,476,215 A | 10/1984 | Kausch | |
| 4,499,163 A | 2/1985 | Ishimaru et al. | |
| 4,510,227 A | 4/1985 | Mohr et al. | |
| 4,537,855 A | 8/1985 | Ide | |
| 4,687,727 A | 8/1987 | Toyama et al. | |
| 4,772,538 A | 9/1988 | Walls et al. | |
| 4,950,581 A | 8/1990 | Koike et al. | |
| 4,952,478 A | 8/1990 | Miyagawa et al. | |
| 5,080,999 A | 1/1992 | Imai et al. | |
| 5,200,292 A | 4/1993 | Shinozaki et al. | |
| 5,246,816 A | 9/1993 | Yamasita et al. | |
| 5,340,699 A | 8/1994 | Haley et al. | |
| 5,384,357 A * | 1/1995 | Levinson et al. | 524/770 |
| 5,641,608 A | 6/1997 | Grunwald et al. | |
| 5,705,322 A | 1/1998 | West et al. | |
| 5,919,601 A | 7/1999 | Nguyen et al. | |
| 5,952,154 A | 9/1999 | Barr et al. | |
| 5,965,319 A | 10/1999 | Kobayashi | |
| 6,013,412 A | 1/2000 | Aoshima | |
| 6,030,750 A | 2/2000 | Vermeersch et al. | |
| 6,309,792 B1 | 10/2001 | Hauck et al. | |
| 6,399,689 B1 | 6/2002 | Scarlette | |
| 6,423,462 B1 | 7/2002 | Kunita | |
| 6,482,571 B1 | 11/2002 | Teng | |
| 6,566,035 B1 | 5/2003 | Aoshima | |
| 6,576,401 B2 | 6/2003 | Teng | |
| 6,692,896 B2 | 2/2004 | Shimada et al. | |
| 6,716,566 B2 | 4/2004 | Aoshima | |
| 6,733,948 B2 | 5/2004 | Nakamura et al. | |
| 6,780,562 B2 | 8/2004 | Sorori et al. | |
| 6,794,116 B2 | 9/2004 | Oshima | |
| 6,800,417 B2 | 10/2004 | Kikuchi | |
| 6,838,222 B2 | 1/2005 | Aoshima et al. | |
| 6,858,374 B2 | 2/2005 | Yanaka | |
| 6,861,200 B2 | 3/2005 | Oshima | |
| 6,884,568 B2 | 4/2005 | Timpe et al. | |
| 6,897,006 B2 * | 5/2005 | Fujimoto et al. | 430/273.1 |
| 6,916,595 B2 | 7/2005 | Fujimaki et al. | |
| 2001/0036598 A1 | 11/2001 | Shimada et al. | |
| 2002/0051934 A1 | 5/2002 | Nakamura et al. | |
| 2002/0055058 A1 | 5/2002 | Sorori et al. | |
| 2002/0068240 A1 * | 6/2002 | Teng | 430/280.1 |
| 2002/0160295 A1 | 10/2002 | Aoshima | |
| 2002/0177074 A1 | 11/2002 | Hoshi et al. | |
| 2002/0197564 A1 | 12/2002 | Timpe et al. | |
| 2003/0008239 A1 | 1/2003 | Fujimaki et al. | |
| 2003/0068575 A1 | 4/2003 | Yanaka | |
| 2003/0073032 A1 | 4/2003 | Aoshima | |
| 2003/0082478 A1 | 5/2003 | Itakura et al. | |
| 2003/0162127 A1 | 8/2003 | Kikuchi | |
| 2003/0186174 A1 | 10/2003 | Nagase | |
| 2003/0198894 A1 | 10/2003 | Mizutani et al. | |
| 2003/0207204 A1 | 11/2003 | Sugasaki et al. | |
| 2004/0063034 A1 | 4/2004 | Goto | |
| 2004/0072101 A1 | 4/2004 | Sugasaki et al. | |
| 2004/0131971 A1 | 7/2004 | Sugasaki et al. | |
| 2004/0170920 A1 | 9/2004 | Goto | |
| 2004/0170922 A1 | 9/2004 | Goto | |
| 2004/0175648 A1 | 9/2004 | Goto | |
| 2004/0202957 A1 | 10/2004 | Murota | |

(Continued)

FOREIGN PATENT DOCUMENTS

CA        1338095        2/1996

(Continued)

OTHER PUBLICATIONS

Machine-assisted English translation of JP2002-202595, provided by JPO.*
XP-002275533—"Advanced organic chemistry: reactions, mechanisms, and structure" (1992), Wiley-Interscience, $4^{th}$ Ed., USA, p. 280.
Europe Search Report dated Apr. 16, 2004.
Mineo et al, English abstract of JP Application 08062834 dated Mar. 8, 1996, 1 pg, Patent abstracts of Japan 1996.
Benzyl from the American Heritage Dictionary of the English Language.
Registry No. 2154-56-5, one page, "benzyl".
McGinniss, Vincent D. "Radiation Curing: 6" Kirk-Othmer Encyclopedia of Chemical Technology (1996).

(Continued)

Primary Examiner — Sin J. Lee
(74) Attorney, Agent, or Firm — Sughrue Mion, PLLC

(57) ABSTRACT

A polymerizable composition containing: (A) a binder polymer; (B) a compound having a polymerizable unsaturated group; and (C) a compound which has a triarylsulfonium salt structure and in which a sum of Hammett's σ constants of all substituents bonded to the aryl skeleton is larger than 0.46.

3 Claims, No Drawings

U.S. PATENT DOCUMENTS

| | | |
|---|---|---|
| 2004/0223042 A1 | 11/2004 | Goto |
| 2004/0244619 A1 | 12/2004 | Goto |
| 2005/0026082 A1 | 2/2005 | Shimada |
| 2005/0037282 A1 | 2/2005 | Sonokawa |

FOREIGN PATENT DOCUMENTS

| | | |
|---|---|---|
| EP | 0 377 321 A2 | 7/1990 |
| EP | 0 684 522 A1 | 11/1995 |
| EP | 0 779 161 A1 | 6/1997 |
| EP | 0 919 870 A1 | 6/1999 |
| EP | 0 950 517 A1 | 10/1999 |
| EP | 0 950 518 A1 | 10/1999 |
| EP | 1 033 624 A1 | 9/2000 |
| EP | 1 096 315 A1 | 5/2001 |
| EP | 1 110 747 A1 | 6/2001 |
| EP | 1 160 095 A2 | 12/2001 |
| EP | 1 176 467 A1 * | 1/2002 |
| EP | 1 182 033 A1 | 2/2002 |
| EP | 1 186 407 A1 | 3/2002 |
| EP | 1 216 830 | 6/2002 |
| EP | 1 219 464 A2 | 7/2002 |
| EP | 1 235 107 A1 | 8/2002 |
| EP | 1 241 002 A2 | 9/2002 |
| EP | 1 245 405 A2 | 10/2002 |
| EP | 1 249 343 A2 | 10/2002 |
| EP | 1 249 731 A2 | 10/2002 |
| EP | 1 332 870 A2 | 8/2003 |
| EP | 1 338 921 A2 | 8/2003 |
| EP | 1 341 040 A1 | 9/2003 |
| EP | 1 369 231 A2 | 12/2003 |
| EP | 1 400 851 A2 | 3/2004 |
| EP | 1 449 650 A2 | 8/2004 |
| EP | 1 450 207 A1 | 8/2004 |
| GB | 1 521 372 | 8/1978 |
| JP | 54-25957 | 2/1979 |
| JP | 54-34327 | 3/1979 |
| JP | 54-92723 A | 7/1979 |
| JP | 58-12577 A | 1/1983 |
| JP | 58-29803 A | 2/1983 |
| JP | 58-134629 A | 8/1983 |
| JP | 59-44615 A | 3/1984 |
| JP | 59-71048 A | 4/1984 |
| JP | 2-161442 A | 6/1990 |
| JP | 4-31863 A | 2/1992 |
| JP | 4-106548 A | 4/1992 |
| JP | 7-20629 A | 1/1995 |
| JP | 7-271029 A | 10/1995 |
| JP | 8-108621 A | 4/1996 |
| JP | 9-43847 | 2/1997 |
| JP | 2712564 B2 | 2/1998 |
| JP | 10-195119 A | 7/1998 |
| JP | 11-258801 A | 9/1999 |
| JP | 2000-131837 A | 5/2000 |
| JP | 2000-267265 A | 9/2000 |
| JP | 2001-133969 A | 5/2001 |
| JP | 2002-40652 A | 2/2002 |
| JP | 2002-072462 A | 3/2002 |
| JP | 2002-202595 * | 7/2002 |
| WO | WO 00/48836 A1 | 8/2000 |

OTHER PUBLICATIONS

SR-295, product bulletin Sartomer Co. (1998).
SR-399, product bulletin Sartomer Co. (1998).
SR-492, product bulletin Sartomer Co. (1998).
CD 501, product bulletin, Sartomer Co. (1999).
SR-368, product bulletin, Sartomer Co. (1998).
Product Data, Subscript 550 Styrene Maleic Anhydride Copolymer Solid (1999).
Search Report dated Jun. 14, 2005.
Search Report dated Jan. 16, 2004.
Patent Abstracts of Japan, 59-053836 published Mar. 28, 1984 (also published as U.S. 4,687,727).
Search Report dated Jul. 2, 2002.

* cited by examiner

POLYMERIZABLE COMPOSITION AND LITHOGRAPHIC PRINTING PLATE PRECURSOR

FIELD OF THE INVENTION

This invention relates to a polymerizable composition having a sensitivity to the infrared wavelength range and a lithographic printing plate precursor. More specifically speaking, it relates to a polymerizable composition appropriately usable in a negative type lithographic printing plate precursor, whereby a plate can be directly made using infrared laser beams from digital signals of a computer or the like, i.e., so-called direct plate making, and a lithographic printing plate precursor with the use of the composition.

BACKGROUND OF THE INVENTION

In recent years, laser technology has been remarkably advanced in particular, downsizing and output power up have been made in solid lasers and semiconductor lasers which have light emitting regions in the near infrared to infrared ranges. Accordingly, these lasers are highly useful as exposure light sources in direct plate making from digital data available from computers and so on.

In a negative type lithographic printing plate precursor for infrared lasers with the use of such an infrared laser as described above, which has a light emitting region in the infrared range, as an exposure light source, an image is formed by using, for example, a photopolymerizable composition in its recording layer.

As the existing methods of forming an image by light exposure with the use of a photopolymerizable composition, there have been known various methods, for example, a method which comprises forming a recording layer with the use of a photopolymerizable composition containing an ethylenically unsaturated compound and a photopolymerization initiator on the surface of a support, carrying out image-exposure to thereby polymerize and harden the ethylenically unsaturated compound in the exposed part and then solubilizing and removing the unexposed part to thereby form a hardened relief image, a method which comprises causing a change in the pressure-sensitive adhesion strength of a photopolymerizable composition layer (a recording layer) by light exposure and then peeling off the support to thereby form an image, a method of forming an image by taking advantage in a change in the toner-adhesion properties of a photopolymerizable composition layer caused by light, and soon. As the photopolymerization initiators in these methods, it hap been a practice to employ compounds sensible to short-wavelength rays mainly in the ultraviolet range of 400 nm or less such as benzoin, benzoin alkyl ethers, benzyl ketal, benzophenone, anthraquinone, benzyl ketone and Michler's ketone.

With the recent development in the image-forming techniques, on the other hand, sensitive materials showing high sensitivity to lights in the visible range have been strongly required. For example, a large number of photopolymerizable compositions having widened sensitivity ranges, i.e., around 500 nm are proposed for the laser plate making system using argon ion laser oscillation beam of 488 nm. Moreover, studies are vigorously made on photopolymerizable compositions to lights in the longer wavelength range exceeding 600 nm appropriate for the laser plate making system with the use of He—Ne lasers or semiconductor lasers and full-color image replication techniques.

There have been known photopolymerizable compositions containing an ethylenically unsaturated compound and a photopolymerization initiation system in which heterocycles are linked via a mono-, tri-, penta- or heptamethine chain in the photopolymerization initiation system and which contain a cyanine colorant having a specific structure and an s-triazine derivative having a specific structure (see, for example, JP-A-58-29803 and JP-A-4-31863). Also, there have been proposed photopolymerizable compositions in which a photopolymerization initiator system comprises a squarylium compound having a specific structure and a specific s-triazin compound (see, for Trample, JP-A-4-106548).

However, it is known that a photopolymerization initiator usually shows a rapid decrease in the sensitivity in the ability to emit active radicals to rays having wavelengths of 500 nm or more, in particular, rays having wavelengths of 600 nm or more. None of the above-described photopolymerizable compositions having been proposed has a satisfactory sensitivity to these rays in the longer wavelength range. In addition, there is another problem that the photopolymerization reaction would proceeds when handled under a white fluorescent lamp. Namely, a photopolymerizable composition having stable qualities can be hardly obtained at present.

In order to elevate the sensitivity of the above-described photopolymerizable compositions and improve the handling properties thereof under a white fluorescent light, photopolymerizable compositions containing an ethylenically unsaturated compound, a specific pigment and a photopolymerization initiator (a triazine compound or the like) have been proposed (see, for example, JP-A-2000-131837).

However, a lithographic printing plate having such a composition in the recording layer shows a low stability in preserving the printing plate. Therefore, it has been urgently required to elevate the sensitivity while maintaining a practically satisfactory stability.

SUMMARY OF THE INVENTION

The invention aims at solving the above-described problems occurring hitherto and thus achieving the following objects. Namely, an object of the invention is to provide a polymerizable composition which has a practically satisfactory storage stability can be polymerized at a high sensitivity and can be hardened, and a lithographic printing plate precursor with the use of the same whereby an image can be formed at a high sensitivity. Another object of the invention is to provide a lithographic printing plate precursor wherein damages in the image part in the development after the exposure are effectively lessened.

The inventors have conducted intensive studies to solve the above problems and consequently found out that the above-described objects can be achieved by a polymerizable composition containing a specific compound as a polymerization initiator and a negative type lithographic printing plate precursor containing this polymerizable composition in the recording layer, thereby completing the invention.

That is to say, a polymerizable composition according to an aspect of the invention is characterized by containing (A) a binder polymer, (B) a compound having a polymerizable unsaturated group, and (C) a compound which has a triarylsulfonium salt structure and in which the sum of Hammett's constants of all substituents bonded to the aryl skeleton is larger than 0.46.

Preferably, the compound (C) has a triarylsulfonium cationic structure containing three or more halogen atoms and has an organic anion.

It is preferable that the above-described polymerizable composition further contains (D) a compound having an absorption maximum at 700 to 1200 nm.

A lithographic printing plate precursor according to another aspect of the invention is characterized by being provided with a recording layer containing (A) a binder polymer, (B) a compound having a polymerizable unsaturated group, and (C) a compound which has a triarylsulfonium salt structure and in which the sum of Hammett's constants of all substituents bonded to the aryl skeleton is larger than 0.46, on a support. In a still preferable embodiment, that the above-described recording layer further contains (D) a compound having an absorption maximum at 700 to 1200 mm.

Although the function of the invention still remains unclear, it is considered that, in this polymerizable composition, the compound (C) having a triarylsulfonium salt structure and the sum of Hammett's constants of all substituents bonded to the aryl skeleton being larger than 0.46, which has an effect of causing the initial and progress of the polymerization of the compound (B) having a polymerizable unsaturated group, has a high stability owing to its main skeleton and, moreover, an improved degradation performance upon exposure due to accelerated thermal degradation or a decrease in the potential, thereby bringing about a high sensitivity.

By introducing a hydrophobic group such as a haloalkyl group or a halogen atom as this electron-attracting group, the hydrophobic nature of an exposed part (an image-formation region) is improved. In the case of employing in the recording layer of a lithographic printing plate precursor, this polymerizable composition has such advantages that the alkali-resistant developing properties, discrimination and printing tolerance might be improved and, furthermore, the film loss damage in an image part due to a developing solution employed in the development might be relieved.

DETAILED DESCRIPTION OF TEE INVENTION

Now, the invention will be illustrated in greater detail.

The polymerizable composition according to the invention is a polymerizable composition which contains (A) a binder polymer, (B) a compound having a polymerizable unsaturated group, and (C) a compound which has a triarylsulfonium salt structure and in which the sum of Hammett's constants of all substituents bonded to the aryl skeleton is larger than 0.46.

The lithographic printing plate precursor according to the invention is a negative to lithographic printing plate precursor provided with a recording layer containing the above-described polymerizable composition according to the invention.

Owing to the above constitutions, the polymerizable composition and the lithographic printing plate precursor according to the invention enable polymerization or recording at a high sensitivity and, moreover, the damage in an image part due to film loss in the development might be effectively relieved.

Next, the factors constituting the polymerizable composition according to the invention or the lithographic printing plate precursor according to the invention will be illustrated one by one. First, the compound (C) which has a triarylsulfonium salt structure and in which the sum of Hammett's constants of all substituents bonded to the aryl skeleton is larger than 0.46, i.e., the characteristic component of the invention, will be illustrated in detail.

[(C) Compound Having a Triarylsulfonium Salt Structure and the Sum of Hammett's Constants of all Substituents Bonded to the Aryl Skeleton Therein being Larger than 0.46]

The polymerizable composition according to the invention or the recording layer of the lithographic printing plate precursor according to the invention contains (C) a compound which has a triarylsulfonium salt structure and in which the sum of Hammett's a constants (Hammet's substituent constants of all substituents bonded to the aryl skeleton is larger than 0.46 (hereinafter optionally referred to as "a specific compound").

The component (C) according to the intention acts as a polymerization initiator.

—Triarylsulfonium Salt Structure—

Compounds having a triarylsulfonium salt structure are know as, for example, polymerization initiators. These sounds can be easily synthesized by, for example, the methods described in J. Amer. Chem. Soc., Vol. 112 (16), 1990; pp 6004-6015, J. Org. Chem., 1988; pp 5571-5573, WO 02/081439 A1, EP No. 1113005, etc.

—Substituents Bonded to the Aryl Skeleton—

As the substituents bonded to the aryl skeleton of the triarylsulfonium salt structure in the specific compound, electron-attracting a groups are preferable. It is required that the sum of Hammett's a constants of all substituents bonded to the aryl skeleton is larger than 0.46, preferably than 0.60. In the case where the sum of Hammett's constants is not larger than 0.46, the effect of elevating the sensitivity, which is an advantage of the invention, cannot be sufficiently established.

Since Hammett's a constant shows the degree of the electron-attracting properties of cations having the triarylsulfonium salt structure, the upper limit thereof is not particularly restricted from the viewpoint of elevating the sensitivity. Considering the reactivity and stability, however, it is preferable that Hammett's constant is larger than 0.46 but smaller than 4.0, still preferably larger than 0.50 but smaller than 3.5 and particularly preferably larger than 0.60 but smaller than 3.0.

Hammett's constants employed in the invention mean the values described in *Kagaku Semina* 10, *Hamettosoku-Kozo to Hannousei-*, ed. by Naoki Inamoto (1983, Maruzen).

Examples of the electron-attracting substituents to be introduced into the aryl skeleton include a trifluoromethyl group, halogen atoms, ester groups, sulfoxide groups, a cyano group, amide groups, a carboxyl group, a carbonyl group and so on. Hammett's constants of these groups are as follows: trifluoromethyl group (—$CF_3$, m:0.43, p:0.54), halogen atoms [for example, —F (m:0.34, p:0.06), —Cl (m:0.37, p:0.23), —Br (m:0.39, p:0.23), —I (m:0.35, p:0.18)], ester groups (for example, —$COCH_3$, m:0.37, p: 0.45), sulfoxide groups (for example, —$SOCH_3$, m:0.52, p:0.45), cyano group (—CN, m:0.56, p:0.66), amide groups (for example, —$NHCOCH_3$, m:0.21, p:0.00), carboxyl group (—COOH, m:0.37, p:0.45), carbonyl group (—CHO, m:0.36, p: (0.43)) and so on. Values in parentheses mean the position of the corresponding substituent introduced into the aryl skeleton and its Hammett's constant. Namely, (m:0.50) means that the corresponding substituent introduced into the meta-position has a Hammett's constant of 0.50.

Among these substituents, nonionic Constituents such as halogen atom and haloalkyls are preferable from the viewpoint of hydrophobic nature. In particular, —Cl is preferable from the viewpoint of reactivity, while —F, —$CF_3$, —Cl and —Br are preferable from the viewpoint of making a film hydrophobic.

Such substituents may be introduced either one of the three aryl skeletons of the triarylsulfonium salt structure or two or more aryl skeletons thereof. Either one or more substituents may be introduced in each of the three aryl skeletons. That is to say, the substitution positions and number of the substituents introduced into these aryl skeletons may be arbitrarily selected, so long as the sum of Hammett's constants of the substituents exceeds 0.46. For example, one substituent having a large Hammett's constant (i.e., exceeding 0.46) alone may be introduced into one of the aryl skeletons of the triarylsulfonium salt structure. Alternatively, plural substituents, the sum of Hammett's constants of which exceeds 0.46, may be introduced together.

As discussed above, Hammett's constant of a substituent varies depending on the introduction position Therefore, the sum of Hammett's a constants in the triarylsulfonium salt initiator according to the invention is determined depending on the type, introduction position and number of the substituents.

Meanwhile, although the m- and p-positions are employed in the expression of Hammett's rule, it is assumed in the calculation in the invention that the substituent effect at the o-position as an indication of the electron-attracting properties is the same as the value at the p-position. The substitution position is preferably m- and p-positions from the synthetic viewpoint, and the most preferably p-position.

In the invention, a sulfonium salt which is substituted with not less than three halogen atoms is preferred, and a sulfonium salt which is substituted with three chloro groups is the most desirable. More specifically speaking, a triarylsulfonium salt structure having a halogen atom, most preferably —Cl group, introduced into each of the three aryl skeletons is desirable wherein those having all the —Cl groups introduced in p-positions are more preferable.

From the viewpoint of stability, preferable examples of the counter anion in the specific compound include a sulfonate anion, a benzoylformate anion, $PF_6^-$, $BF_4^-$, $ClO_4^-$, carboxylate anions, a sulfinate anion, a sulfate anion, a borate anion, halogen anions, polymeric sulfonate anions and polymeric carboxylate anions. From the viewpoints of reactivity and stability, sulfonate anions, polymeric sulfonate anions, a benzoylformate anion and a polymeric benzoylformate anion are preferable and sulfonate anions and polymeric sulfonate anions are the most desirable.

The specific compound according to the invention may be a low-molecular weight compound, so long as it has a triarylsulfonium salt structure in which substituent(s) are introduced into the aryl skeleton (a) under specific conditions. As described above, it may has plural triarylsulfonium salt structures as counter cations of polymeric anions.

Next, preferable examples [example compounds (A-1) to (O-3) and (P-1) to (P-17)] of the specific compound serving as the component (C) in the invention will be presented, though the invention is not restricted thereto. Example compounds (P-1) to (P-17) are examples of compounds having polymeric anions.

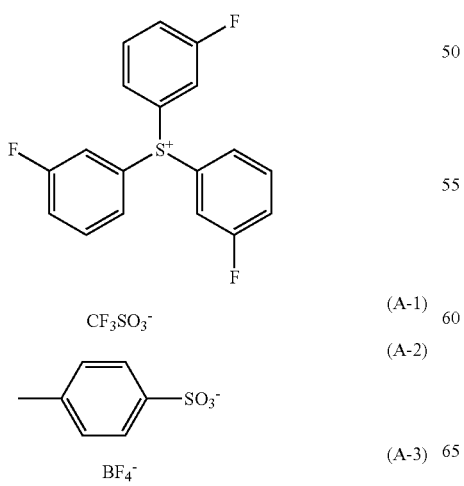

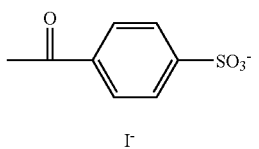 (A-15)
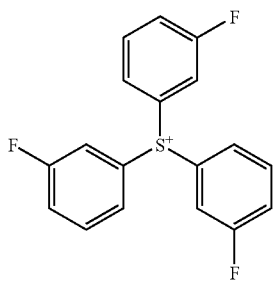 (A-16)
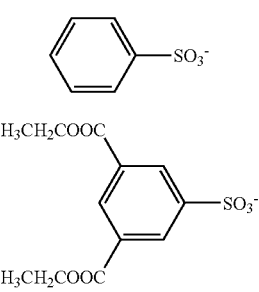 (A-17)
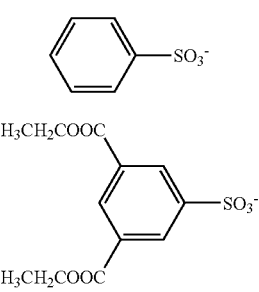
(A-18)
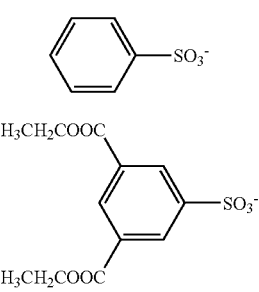
(A-19)
(A-20)
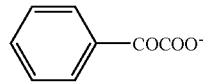
CF$_3$SO$_3^-$ (B-1)
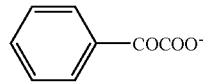 (B-2)
BF$_4^-$ (B-3)
PF$_6^-$ (B-4)
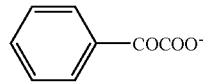COCOO$^-$ (B-5)
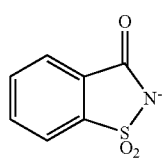 (B-6)
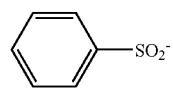 (B-7)
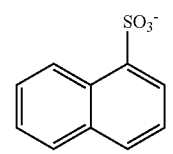 (B-8)
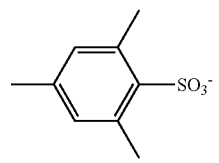 (B-9)
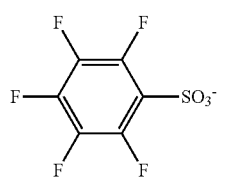 (B-10)
C$_4$F$_9$SO$_3^-$ (B-11)
ClO$_4^-$ (B-12)
CF$_3$COO$^-$ (B-13)
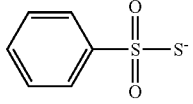 (B-14)
 (B-15)
Br$^-$ (B-16)
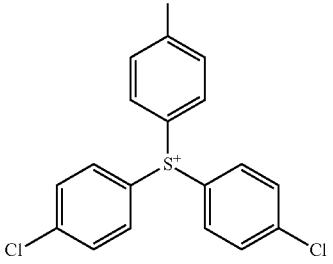
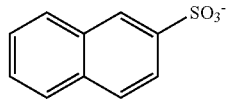 (B-17)

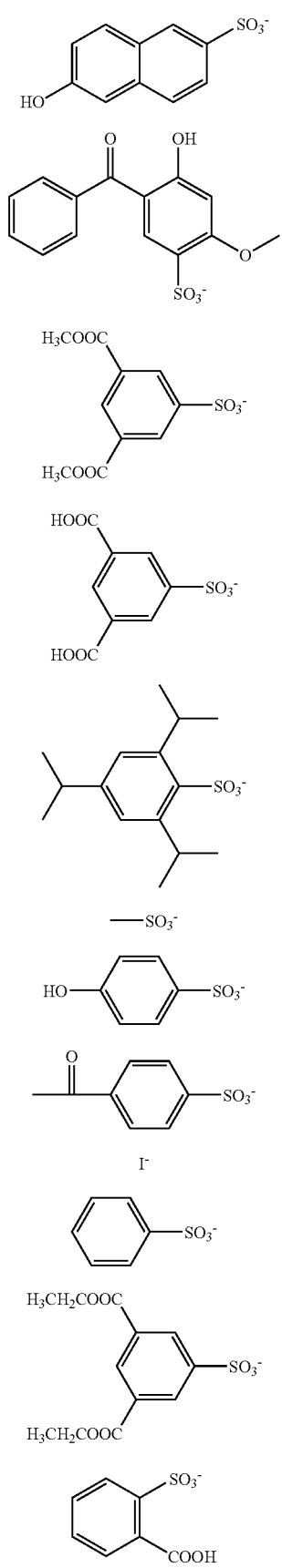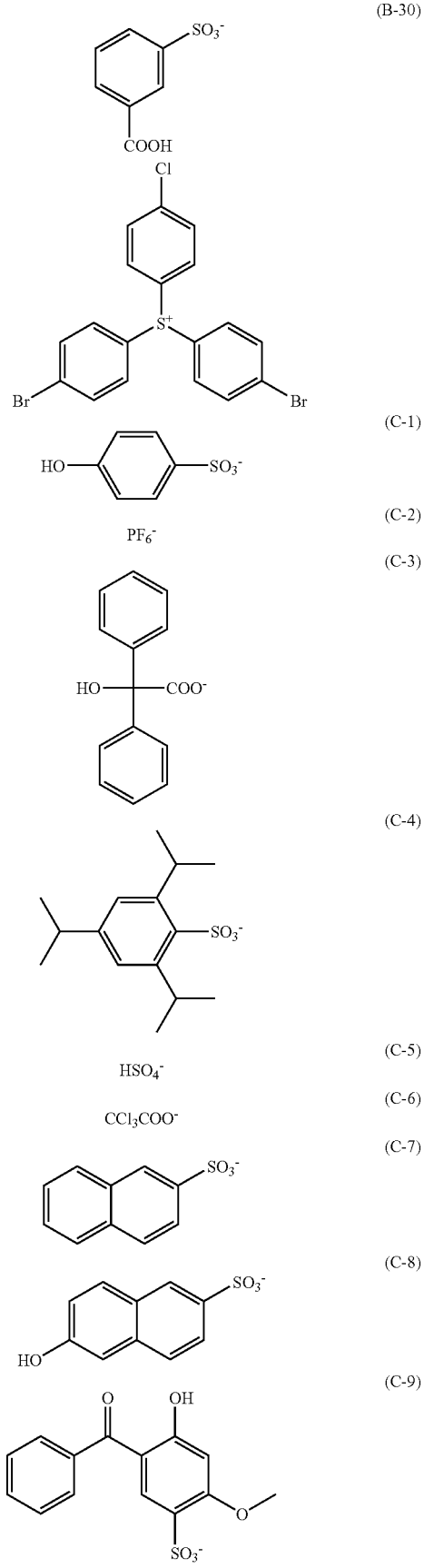

-continued (C-10) 3,5-bis(methoxycarbonyl)benzenesulfonate (C-11) 3,5-dicarboxybenzenesulfonate (D-1) tris(4-fluorophenyl / 4-trifluoromethylphenyl)sulfonium trifluoromethanesulfonate (D-2) p-toluenesulfonate (D-3) BF$_4^-$ (D-4) PF$_6^-$ (D-5) 4-methoxybenzoate (D-6) 2-sulfobenzoate (2-carboxybenzenesulfonate)

(D-7) norbornane-2-carboxylate (D-8) CH$_3$SO$_3^-$ (D-9) naphthalene-2-sulfonate (D-10) naphthalene-1-sulfonate -continued bis(4-chlorophenyl)(4-acetoxy-3,5-dimethylphenyl)sulfonium CF$_3$SO$_3^-$ (E-1) CF$_3$SO$_3^-$ (E-2) benzenesulfonate (E-3) BF$_4^-$ (E-4) ClO$_4^-$ (E-5) 4-(methylthio)benzoylformate (E-6) 1,2-benzisothiazol-3(2H)-one 1,1-dioxide anion (saccharinate)

(E-7) p-toluenesulfinate (E-8) naphthalene-1-sulfonate (E-9) bis(phenylsulfonyl)imide (E-10) pentafluorobenzenesulfonate

C$_4$F$_9$SO$_3^-$ (E-12) C$_{15}$H$_{31}$COO$^-$

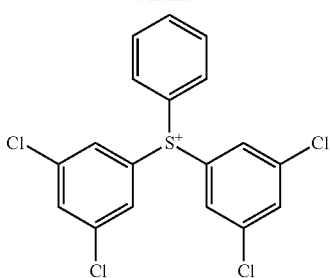
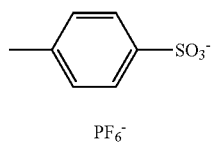  (F-1)
PF$_6^-$  (F-2)
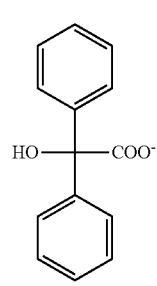  (F-3)
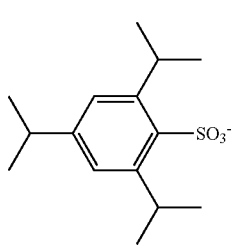
CF$_3$SO$_3^-$  (F-4)
CCl$_3$COO$^-$  (F-5)
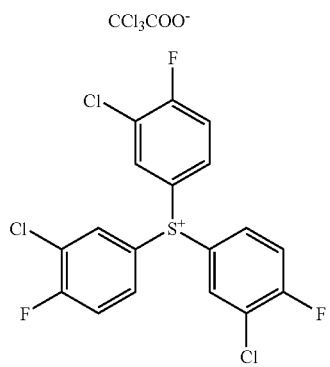
CF$_3$SO$_3^-$  (F-6)
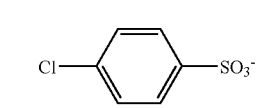  (G-1)
BF$_4^-$  (G-2)
PF$_6^-$  (G-3)
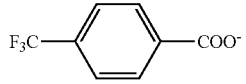  (G-5)
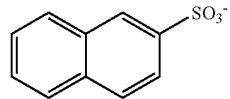  (G-6)
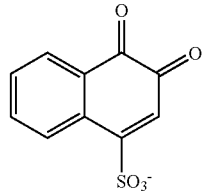
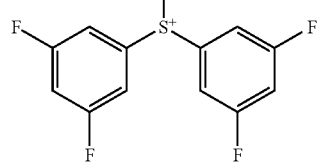
CF$_3$SO$_3^-$  (H-1)
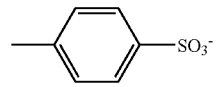  (H-2)
PF$_6^-$  (H-3)
ClO$_4^-$  (H-4)
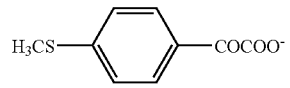  (H-5)
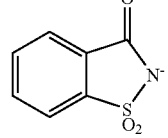  (H-6)
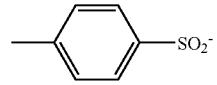  (H-7)
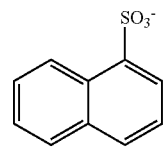  (H-8)
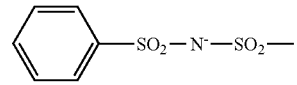  (H-9)

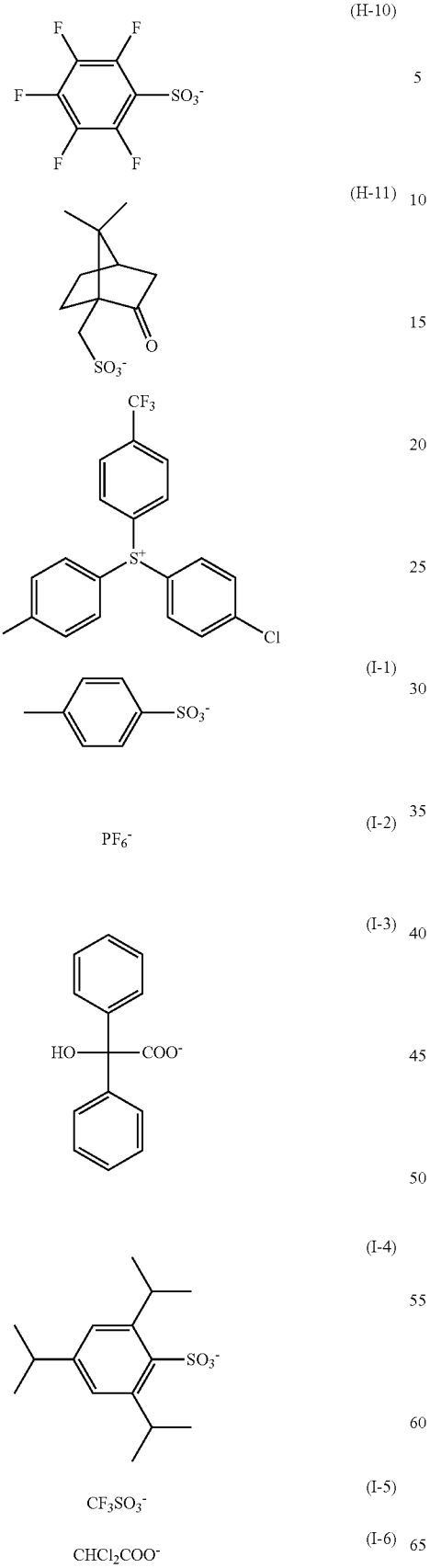
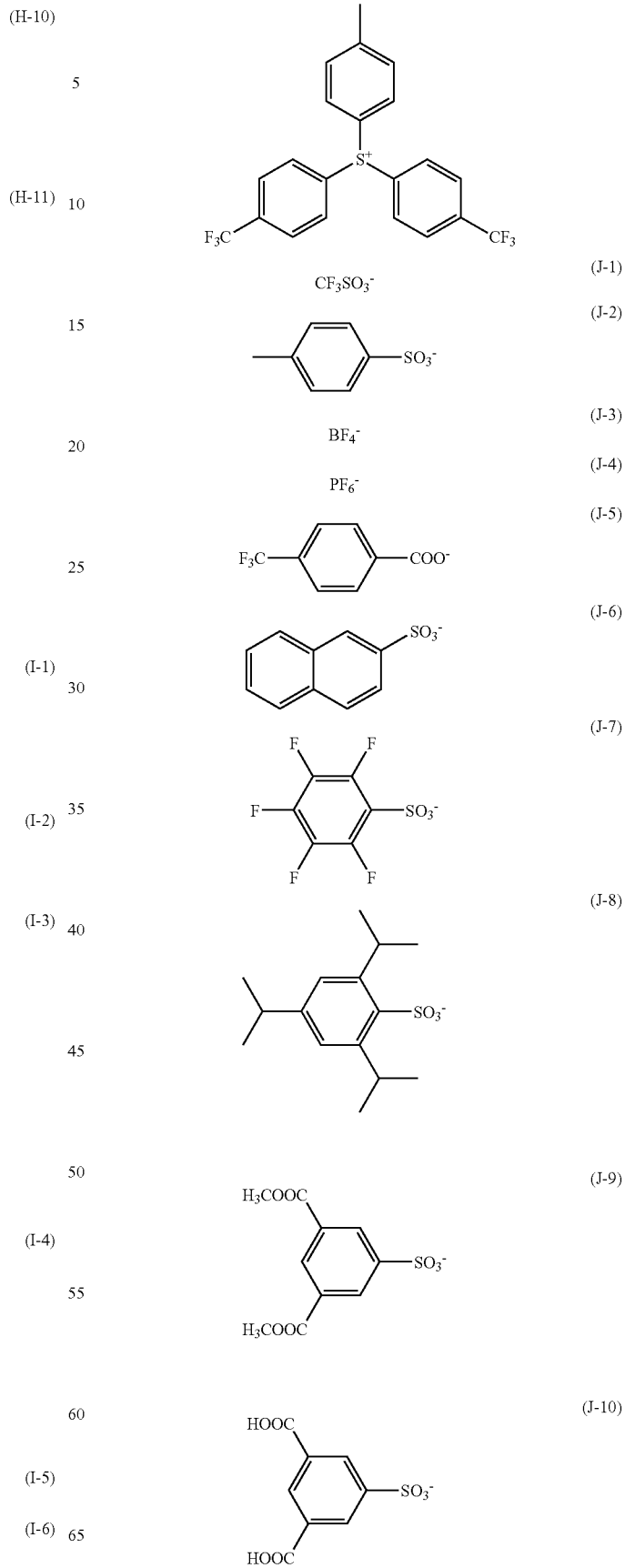

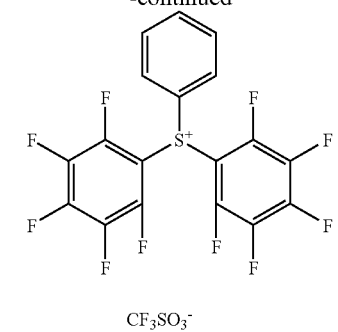
(K-1)
CF₃SO₃⁻
(K-2)
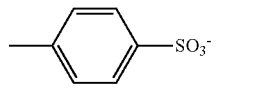
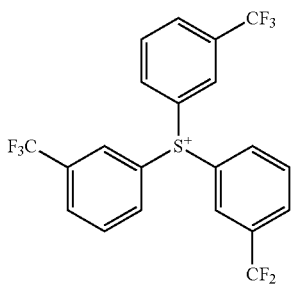
CF₃SO₃⁻
(L-1)
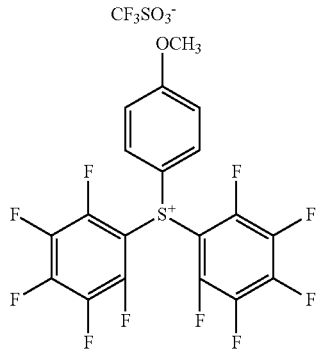
CH₃SO₃⁻
(M-1)
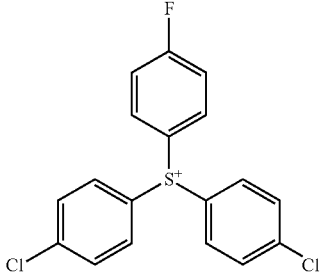
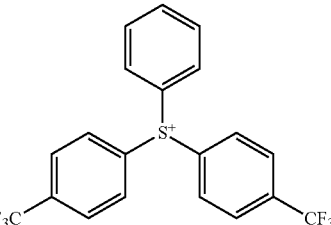
CF₃SO₃⁻
(N-1)
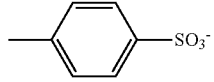
(N-2)
BF₄⁻
(N-3)
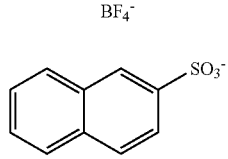
(N-4)
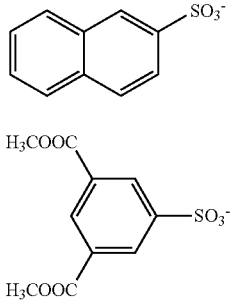
(N-5)
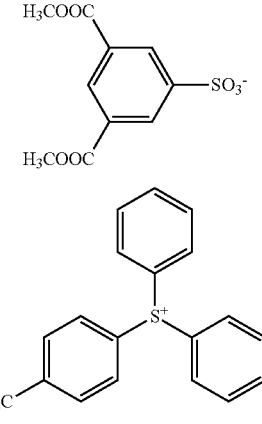
C₄F₉SO₃⁻
(O-1)
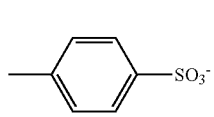
(O-2)
PF₆⁻
(O-3)
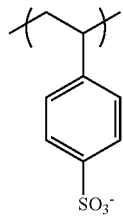
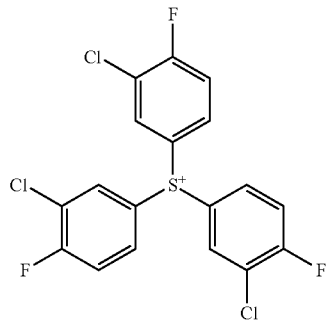
(P-1)

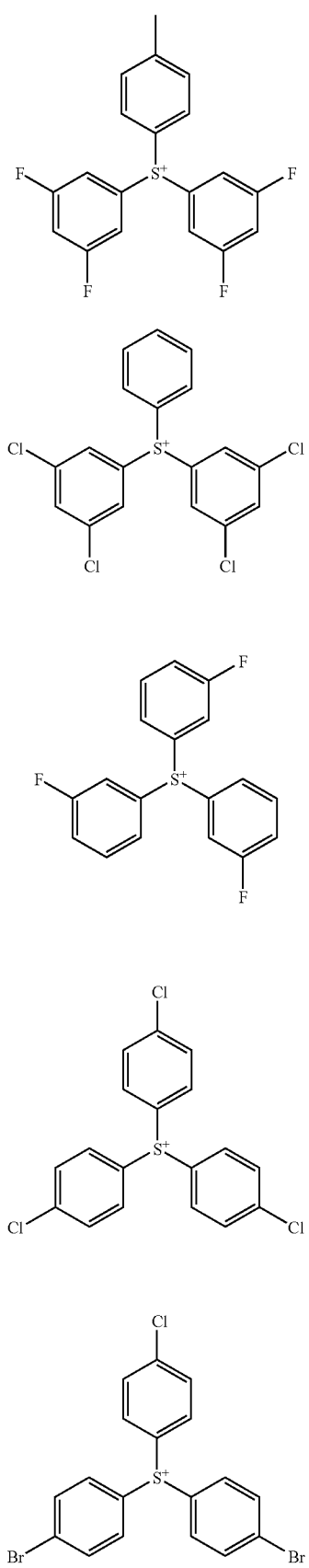
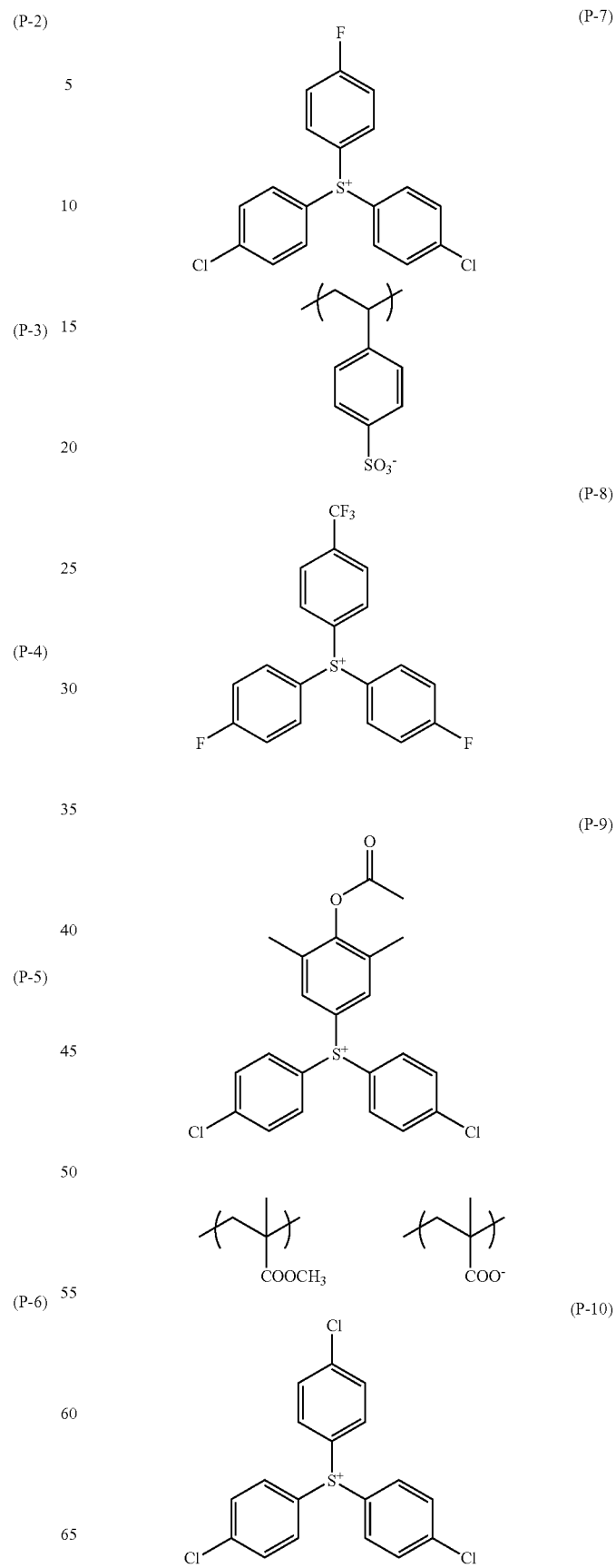

(P-11)
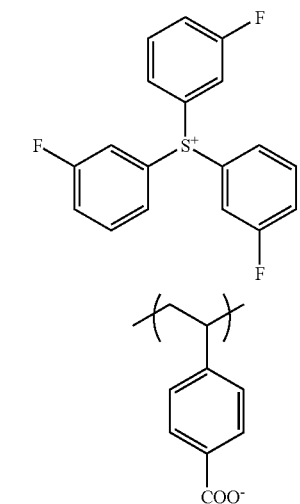

(P-12)
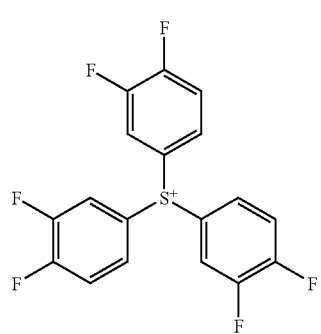

(P-13)
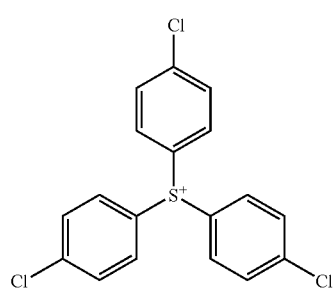

(P-14)
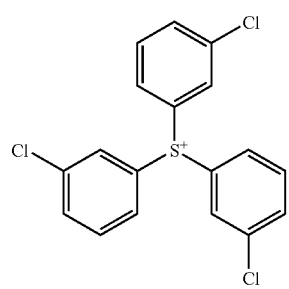

(P-15)
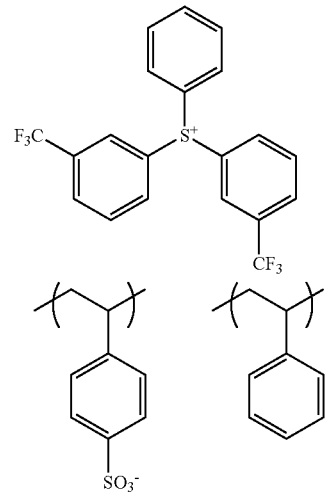

(P-16)

(P-17)
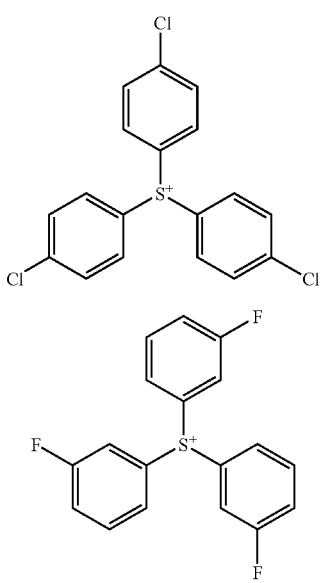

Component (C) associated with the invention, which can be synthesized by publicly known methods as mentioned earlier, will be described in detail by mentioning actual synthesis examples.

Synthesis Example 1

Synthesis of Illustrative Compound B-20

1. Synthesis of tris(4-chlorophenyl)sulfonium Bromide

Under a nitrogen atmosphere, 16.3 g (0.06 mol) of di(4-chlorophenyl)sulfoxide was dissolved in 250 ml dichloromethane. Into the resulting solution kept at 0 to 5° C., 10.8 g (0.10 mol) of trimethylchlorosilane was added dropwise; the mixture was stirred at 0° C. for 30 min. Thereafter, 200 g of a tetrahydrofuran (THF) solution of the Grignard reagent prepared by the usual process with 4-bromochlorobenzene (0.18 mol) was added dropwise over the period of 30 min into the reaction vessel cooled with 0 to 10° C. ice water. After agitated for one hr at 0° C., followed by another hr agitation at room temperature, the reaction solution was slowly poured into an aqueous solution containing 250 ml of an aqueous 12% hydrogen bromide solution and ice, then extracted with 250 ml dichloromethane. The extract was dried with sodium sulfate.

After solvent removal, the extract was added with 100 ml methanol. With 30 min agitation, a solid matter deposited, which was removed by filtration. And, the filtrate was concentrated following by twice washing each with 100 ml ethyl acetate. Under refluxing, the reaction product was solidified in ethyl acetate whereby 12.0 g (44.%) of white solid (tris(4-chlorophenyl)sulfonium bromide) was obtained.

2. Synthesis of Illustrative Compound B-20

Into the aqueous solution consisting of 3.26 g of sodium dimethyl 5-sulfoisophthalate dissolved in 100 ml distilled water, 4.46 g of the tris(4-chlorophenyl)sulfonium bromide prepared above and dissolved in 50 ml dichloromethane was poured, and the mixture was agitated for one hr. The organic layer was extracted and washed with 100 ml water. After drying with sodium sulfate, the organic layer was concentrated. To the concentrated organic layer, 100 ml ethyl acetate was poured. The mixture was agitated for 30 ml under refluxing. After cooling, the organic layer was filtered along with washing with ethyl acetate. The filtrate was dried at 40° C. in vacuo for 6 hr to obtain 5.45 g solid (85.2% yield). Confirmation by NMR analysis proved that the structure of this solid is that of Illustrative Compound (B-20).

Synthesis Example 2

Synthesis of Illustrative Example B-17

Into the aqueous solution consisting of 4.60 g of sodium 2-naphthalenesulfonate dissolved in 100 ml distilled water, 4.46 g of tris(4-chlorophenyl)sulfonium bromide dissolved in 50 ml dichloromethane was poured, and the mixture was agitated for one hr. The organic layer was extracted and washed with 100 ml water. After drying with sodium sulfate, the organic layer was concentrated. To the concentrated organic layer, 100 ml ethyl acetate was poured. The mixture was agitated for 30 min under refluxing. After cooling, the organic layer was filtered along with washing with ethyl acetate. The filtrate was dried at 40° C. in vacuo for 6 hr to obtain 5.07 g solid containing 5.7% by weight of ethyl acetate (88% yield). Conformation by NMR analysis proved that the structure of this solid is that of Illustrative Compound (B-17).

Other compounds can be synthesized in a similar manner.

In the case of being employed in the recording layer of a lithographic printing plate precursor, the component (C) in the polymerizable composition according to the invention is preferably contained in an amount of from 1 to 20% by mass, still preferably from 3 to 12% by mass and most desirably from 4 to 8% by mass, based on the total solid matters.

In addition to the component (C) as described above, the polymerizable composition according to the invention or the recording layer of the lithographic printing plate precursor may contain another publicly known photopolymerization initiator, a thermal polymerization initiator, etc., so long as the effects of the invention are not damaged thereby. More specifically speaking, use may be made of for example, publicly known onium salts, triazine compounds having a trihalomethyl group, peroxides, azo-type polymerization initiators, quinone diazide, etc.

Specific examples of the onium salts appropriately usable in the invention include those cited in the paragraphs [0030] to [0033] in JP-A-2001-133969.

It is also preferable to use publicly known polymerization initiators such as onium salts represented by the formulae (I) to (TV) as set forth in paragraphs [0012] to [0050] in JP-A-9-34110 and thermal polymerization initiators cited in the paragraph [0016] in JP-A-8-108621.

In case of using another polymerization initiator, it is preferable that the content thereof is adjusted to not more than 30% by mass based on the component (C) as described above.

It is preferable that the component (C) according to the invention and another polymerization initiator which is to be used together if desired have each an absorption maximum wavelength of not more than 350 nm, still preferably not more than 320 nm. By adjusting the absorption wavelength within the ultraviolet range as discussed above, the obtained polymerizable composition can be handled even under a white fluorescent lamp.

(A) Binder Polymer

The polymerizable composition according to the invention or the recording layer of the lithographic printing plate precursor according to the invention should contain a binder polymer. As the binder polymer, it is preferable that a linear organic high-molecular weight polymer is contained therein. Such a "linear organic high-molecular weight polymer" may be an arbitrary one. It is preferable to select a linear organic high-molecular weight polymer which is soluble or swellable in water or a weakly alkaline aqueous solution and, therefore, usable in development with water or a weakly alkaline aqueous solution. A linear organic high-molecular weight polymer is appropriately selected and employed not only as a film-forming agent in the composition but also as a developing agent with water, a weakly alkaline aqueous solution or an organic solvent. In case of using a water-soluble organic high-molecular weight polymer, for example, development can be performed with water. Examples of such linear organic high-molecular weight polymer include addition polymers having a carboxylate group in a side chain such as those described in JP-A-59-44615, JP-B-54-34327, JP-B-58-12577, JP-B-54-25957, JP-A-54-92723, JP-A-59-53836 and JP-A-59-71048, and those described in Japanese Patent Application 2002-287920 having been previously proposed by the applicant, namely, methacrylic acid copolymers, acrylic acid copolymers, itaconic acid copolymers, crotonic acid copolymers, maleic acid copolymers, partly esterified maleic acid copolymers, 2-methacryloyloxethyl succinic acid copolymers, 2-methacryloyloxyethyl hexahydrophthalic acid copolymers, etc. Similarly, acidic cellulose derivatives having a carboxylate group in a side chain may be cited. Nor over, products obtained by adding cyclic acid anhydrides to addition polymers having hydroxyl groups are useful too.

From the viewpoint of preventing damages caused by a developing solution, it is particularly preferable that a polymer having a repeating unit represented by the following formula (I), for example, a 2-methacryloyloxyethyl succinic acid copolymer or a 2-methacryloyloxyethyl hexahydrophthalic acid copolymer described in Japanese Patent Application 2002-287920, as the binder polymer.

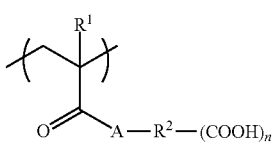

(I)

(In the formula (I), $R^1$ represents a hydrogen atom or a methyl group; $R^2$ represents a linking group containing at least two of a carbon atom, a hydrogen atom, an oxygen atom, a nitrogen atom and a sulfur atom and carrying 2 to 82 atoms; A represents an oxygen atom or —$NR^3$— wherein $R^3$ represents a hydrogen atom or a monovalent hydrocarbon group having 1 to 10 carbon atoms; and n represents an integer of from 1 to 5.)

With regard to the binder polymer having a repeating unit represented by the aforementioned formula (I) in the polymerizable composition of the present invention, the number of the atoms composing the main skeleton of the linking group represented by $R^2$ is preferably 1 to 30, and more preferably the linking group represented by $R^2$ should have an alkylene structure or such a structure in which an alkylene structure is linked via an ester bond.

Now, the repeating unit represented by the formula (I) will be illustrated in greater detail.

In the formula (I), $R^1$ represents a hydrogen atom or a methyl group and a methyl group is particularly preferred.

The linking group represented by $R^2$ comprises at least two kinds of atoms selected from the group consisting of carbon, hydrogen, oxygen, nitrogen and sulfur, and the number of the atoms included in the linking group is from 2 to 82, preferably from 2 to 50, and more preferably 2 to 30. In the case where said linking group has a substituent, the number of atoms defined here means the number of the atoms in the linking group including the substituent.

More specifically, the number of the atoms composing the main skeleton of the linking group represented by $R^2$ is preferably 1 to 30, more preferably 3 to 25, still more preferably 4 to 20, and the most preferably 5 to 10. By way of precaution, the term "the main skeleton of the linking group" indicates the atom or the group of atoms used to solely link A with the terminal COOH in formula (I), and, in particular, in the case where there exist plural linkage channels, this term indicates the atom or the group of atoms composing the channel containing the least number of atoms. Accordingly, in the case where a cyclic structure is included in the linking group, the number of atoms to be calculated varies depending on the position at which the linkage is formed (for example, o-, m-, p-, etc.).

Below, the structure of some specific binder poles of the present invention, the number of atoms composing the main skeleton of the linking group represented by $R^2$ in the structure of the binder polymer, and the method of calculating such number of atoms are described together.

Number of Atoms Composing the Main Skeleton of the Linking Group

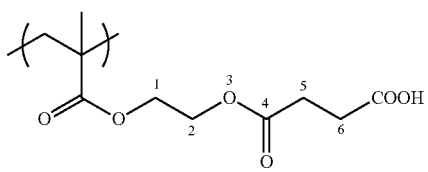

(1)

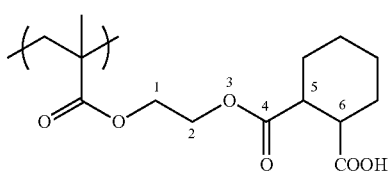

(2)

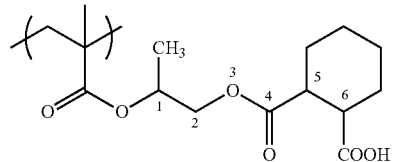

(3)

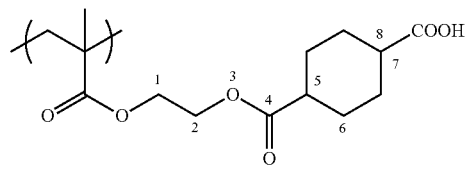

(4)

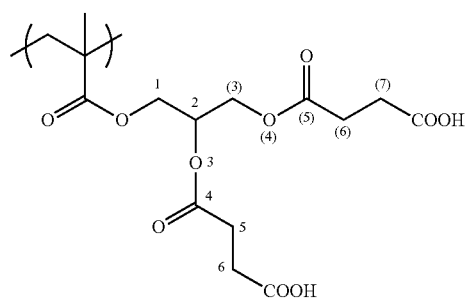

(5)

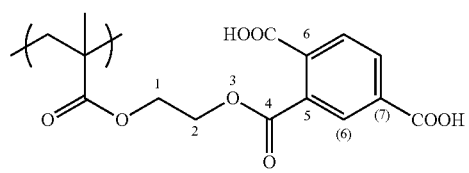

(6)

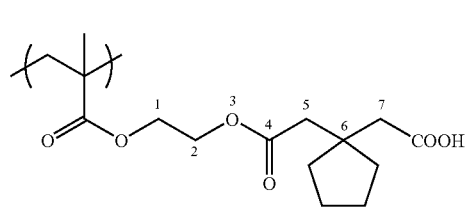

(7)

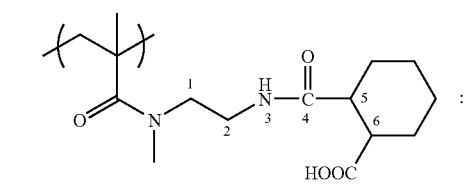

(8)

Number of Atoms Composing the Main Skeleton of the Linking Group

More specifically, as the linking group represented by $R^2$ in formula (I), alkylene, substituted alkylene, arylene, substituted arylene, etc. are included whereby the linking group may have a structure in which a plurality of such divalent group are linked with each other via an amide bond or an ester bond.

As the chain-form linking group, ethylene, propylene, etc. are mentioned. Furthermore, the structure in which these alkylene groups are linked together via ester groups is also a preferable example.

Among all, it is preferable that the linking group represented by $R^2$ in the formula (I) is a (n+1)-valent hydrocarbon group having an alicyclic structure and carrying from 3 to 30 carbon atoms. More specifically speaking, an (n+1)-valent hydrocarbon group obtained by eliminating (n+1) hydrogen atoms on an arbitrary carbon atom from a compound having an alicyclic structure such as cyclopropane, cyclopentane, cyclohexane, cycloheptane, cyclooctane, cyclodecane, dicyclohexyl, tercyclohexyl, norbornane, etc. optionally having one or more arbitrary substituents may be cited. It is also preferable that $R^2$ has from 3 to 30 carbon atoms including the substituent(s).

In the compound having the alicyclic structure, an arbitrary carbon atom may be substituted by one or more heteroatoms selected from among nitrogen, oxygen and sulfur atoms. From the viewpoint of printing tolerance, it is preferable that $R^2$ is an (n+1)-valent hydrocarbon group having an alicyclic structure, which contains two or more rings, has 5 to 30 carbon atoms and may be substituted, such as a fused polycyclic aliphatic hydrocarbon, a crosslinked alicyclic hydrocarbon, a spiro aliphatic hydrocarbon or a mass of aliphatic hydrocarbon rings (in which plural rings are bonded or linked via a linking group to each other). In such a case, the carbon atom number means one counted involving the carbon atoms carried by the substituent(s).

It is still preferable that the linking group represented by $R^2$ has 5 to 10 atoms. From the structural viewpoint, one having a chain-form structure and containing an ester bond therein or one having a cyclic structure as described above are favorable.

Examples of the substituent which can be introduced into the linking group represented by $R^2$ include monovalent non-metallic atomic groups excluding hydrogen, such as halogen atoms (—F, —Br, —Cl, —I), a hydroxyl group, alkoxy groups, aryloxy groups, a mercapto group, alkylthio groups, arylthio groups, alkyldithio groups, aryldithio groups, an amino group, N-alkylamino groups, N,N-dialkylamino groups, N-arylamino groups, N,N-diarylamino groups, N-alkyl-N-arylamino groups, acyloxy groups, a carbamoyloxy group, N-alkylcarbamoyloxy groups, N-arylcarbamoyloxy groups, N,N-dialkylcarbamoyloxy groups, N,N-diarylcarbamoyloxy groups, N-alkyl-N-arylcarbamoyloxy groups, alkylsulfoxy groups, arylsulfoxy groups, acylthio groups, acylamino groups, N-alkylacylamino groups, N-arylacylamino groups, a ureido group, N'-alkylureido groups, N',N'-dialkylureido groups, N'-arylureido groups, N',N'-diarylureido groups, N'-alkyl-N'-arylureido groups, N-alkylureido groups, N-arylureido groups, N'-alkyl-N-alkylureido groups, N'-alkyl-N-arylureido groups, N',N'-dialkyl-N-alkylureido groups, N',N'-dialkyl-N-arylureido groups, N'-aryl-N-alkylureido groups, N'-aryl-N-arylureido groups, N',N'-diaryl-N-alkylureido groups, N',N'-diaryl-N-arylureido groups, N'-alkyl-N'-aryl-N-alkylureido groups, N'-alkyl-N'-aryl-N-arylureido groups, alkoxycarbonylamino groups, aryloxycarbonylamino groups, N-alkyl-N-alkoxycarbonylamino groups, N-alkyl-N-aryloxycarbonylamino groups, N-aryl-N-alkoxycarbonylamino groups, N-aryl-N-aryloxycarbonylamino groups, a formyl group, acyl groups, a carboxyl group and conjugate base groups thereof, alkoxycarbonyl groups, aryloxycarbonyl groups, a carbamoyl group, N-alkylcarbamoyl groups, N,N-dialkylcarbamoyl groups, N-arylcarbamoyl groups, N,N-diarylcarbamoyl groups, N-alkyl-N-arylcarbamoyl groups, alkylsulfinyl groups, arylsulfinyl groups, alkylsulfonyl groups, arylsulfonyl groups, a sulfo group (—SO$_3$H) and conjugate base groups thereof, alkoxysulfonyl groups, aryloxysulfonyl groups, a sulfinamoyl group, N-alkylsulfinamoyl groups, N,N-dialkylsulfinamoyl groups, N-arylsulfinamoyl groups, N,N-diarylsulfinamoyl groups, N-alkyl-N-arylsulfinamoyl groups, a sulfamoyl group, N-alkylsulfamoyl groups, N,N-dialkylsulfamoyl groups, N-arylsulfamoyl groups, N,N-diarylsulfamoyl groups, N-alkyl-N-arylsulfamoyl groups, N-acylsulfamoyl groups and conjugate base groups thereof, N-alkylsulfonylsulfamoyl groups (—SO$_2$NHSO$_2$(alkyl)) and conjugate base groups thereof, N-arylsulfonylsulfamoyl groups (—SO$_2$NHSO$_2$ (aryl)) and conjugate base groups thereof, N-alkylsulfonylcarbamoyl groups (—CONHSO$_2$(alkyl)) and conjugate base groups thereof, N-arylsulfonylcarbamoyl groups (—CONHSO$_2$ (aryl)) and conjugate base groups thereof, alkoxysilyl groups (—Si(O-alkyl)$_3$), aryloxysilyl groups (—Si(O-aryl)$_3$), a hydroxysilyl group (—Si (OH)$_3$) and conjugate base groups thereof, a phosphono group (—PO$_3$H$_2$) and conjugate base groups thereof, dialkylphosphono groups (—PO$_3$(alkyl)$_2$), diarylphosphono groups (—PO$_3$(aryl)$_2$), alkylarylphosphono groups (—PO$_3$ (alkyl) (aryl)), monoalkylphosphono groups (—PO$_3$H (alkyl)) and conjugate base groups thereof, monoarylphosphono groups (—PO$_3$H(aryl)) and conjugate base groups thereof, a phosphonoxy group (—PO$_3$H$_2$) and conjugate base groups thereof, dialkylphosphonoxy groups (—OPO$_3$(alkyl)$_2$), diarylphosphonoxy groups (—OPO$_3$(aryl)$_2$), alkylarylph sphonoxy groups (—OPO$_3$(alkyl) (aryl)), monoalkylph sphonoxy groups (—OPO$_3$H(alkyl)) and conjugate base groups thereof, monoarylphosphonoxy groups (—OPO$_3$H aryl)) and conjugate base groups thereof, a cyano group, a nitro group, dialkylboryl groups (—B(alkyl)$_2$), diarylboryl groups (—B(aryl)$_2$), alkylarylboryl groups (—B(alkyl) (aryl)), a dihydroxyboryl group (—B(OH)$_2$) and conjugate base groups thereof alkylhydroxyboryl groups (—B(alkyl) (OH)) and conjugate base groups thereof, arylhydroxyboryl groups (—B(aryl) (OH)) and conjugate base groups thereof, aryl groups, alkyenyl groups and alkynyl groups.

It is undesirable to use a substituent having a hydrogen atom capable of forming a hydrogen bond, in particular, a substituent having an acidity with a lower acid dissociation constant (pKa) than a carboxylic acid because of having a tendency to worsen printing tolerance, though substituents may be appropriately selected depending on the design of the recording layer. In contrast thereto, hydrophobic substituents such as halogen atoms, hydrocarbon groups (alkyl, aryl, alkenyl and alkynyl groups), alkoxy groups and aryl groups are preferable because of having a tendency to improve printing tolerance. In the case of a monocylic aliphatic hydrocarbon having 6 members or less (for example, cyclopentane or cyclohexane), it is particularly preferable to have these hydrophobic substituents. If possible, these substituents may be bonded to each other or to the hydrocarbon group to which they are attached to thereby form a ring. A substituent may be further substituted.

In the case where A in the formula (I) is —NR$^3$—, R$^3$ represents a hydrogen atom or a monovalent hydrocarbon group having 1 to 10 carbon atoms. Examples of the monovalent hydrocarbon group having 1 to 10 carbon atoms represented by R$^3$ include alkyl groups, aryl groups, alkenyl groups and alkynyl groups.

Specific examples of the alkyl groups include linear, branched or cyclic alkyl groups having 1 to 10 carbon atoms such as a methyl group, an ethyl group, a propyl group, a butyl group, a pentyl group, a hexyl group, a heptyl group, an octyl group, a nonyl group, a decyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, a 1-adamantyl group and a 2-norbornyl group.

Specific examples of the aryl groups include aryl groups having 1 to 10 carbon atom such as a phenyl group, a naphthyl group and an indenyl group and heteroaryl groups having 1 to 10 carbon atoms and containing one heteroatom selected from the group consisting of nitrogen, oxygen and sulfur atoms such as a furyl group, a thienyl group, a pyrrolyl group, a pyridyl group and a quinolyl group.

Specific examples of the alkenyl groups include linear, branched or cyclic alkenyl groups having 1 to 10 carbon atoms such as a vinyl group, a 1-propenyl group, a 1-butenyl group, a 1-methyl-1-propenyl group, a 1-cyclopentenyl group and a 1-cyclohexenyl group.

Specific examples of the alkynyl groups include alkynyl groups having 1 to 10 carbon atoms such as an ethynyl group, a 1-propynyl group, a 1-butynyl group and a 1-octynyl group. A substituent which may be attached to $R^3$ are the same as those cited as the substituents which may be introduced into $R^2$, provided that $R^3$ has 1 to 10 carbon atoms in total including the carbon atoms in its substituent(s).

It is preferable that A in the formula (I) is an oxygen atom or —NH— from the viewpoint of convenience in the synthesis.

In the formula (I), n is an integer of form 1 to 5. From the viewpoint of printing tolerance, it in preferable that n is 1.

Now, preferable examples of the repeating units represented by the formula (I), which constitute binder polymers particularly appropriate in the invention, will be given, though the invention is not restricted thereto.

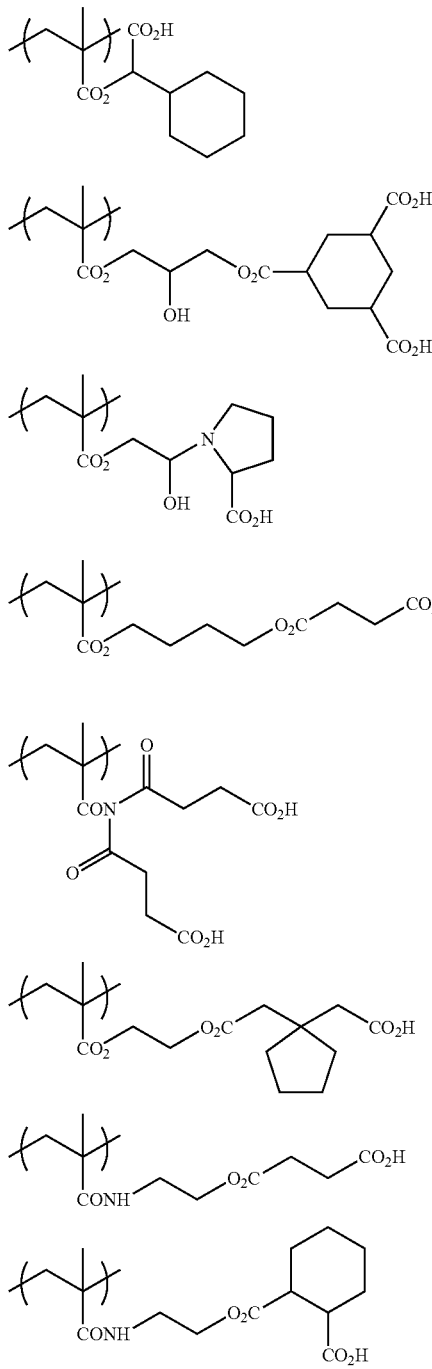
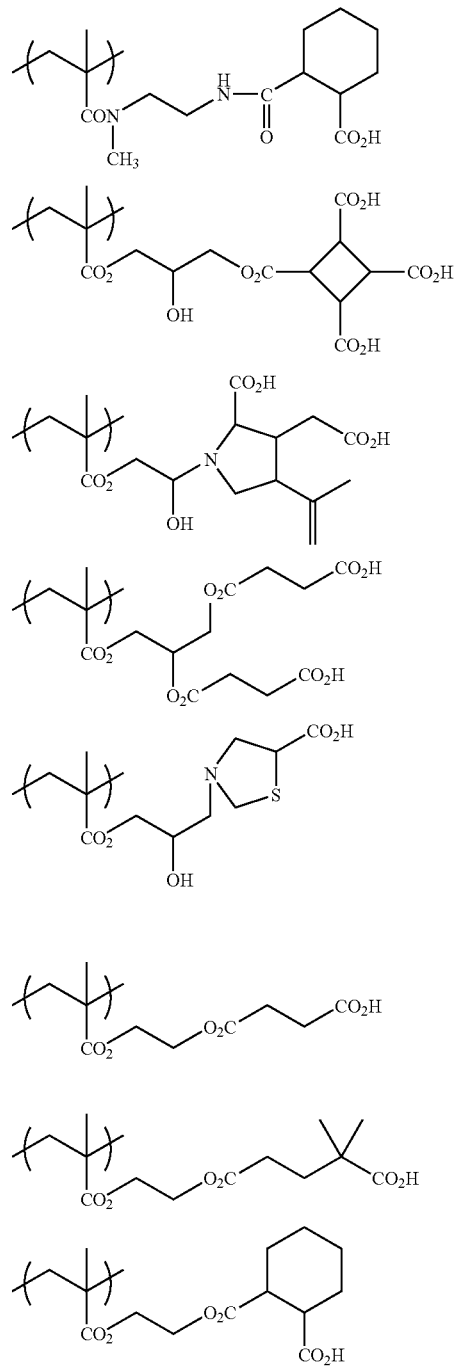

31
32
-continued
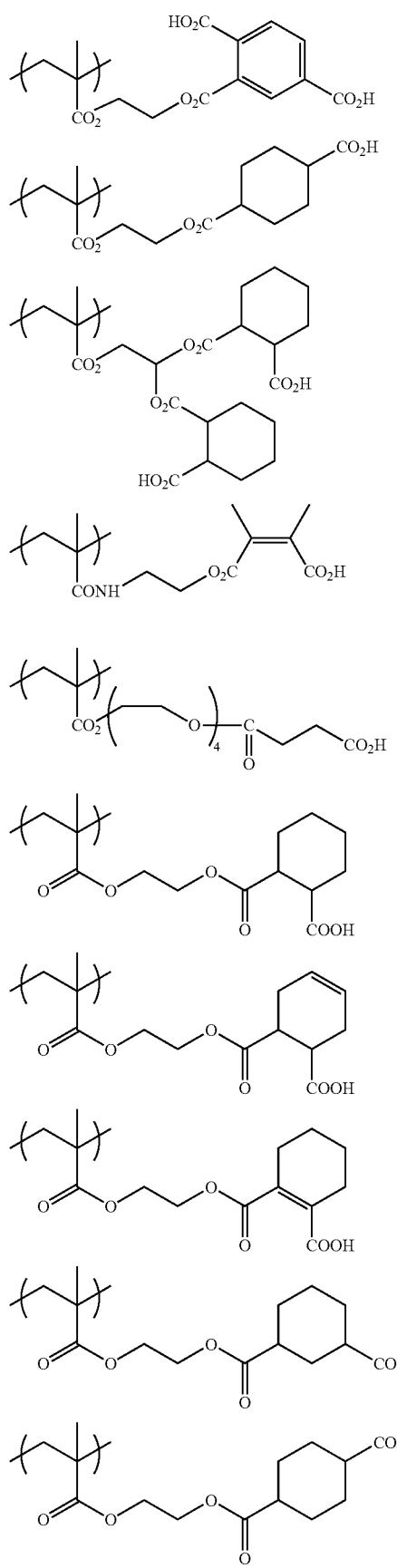
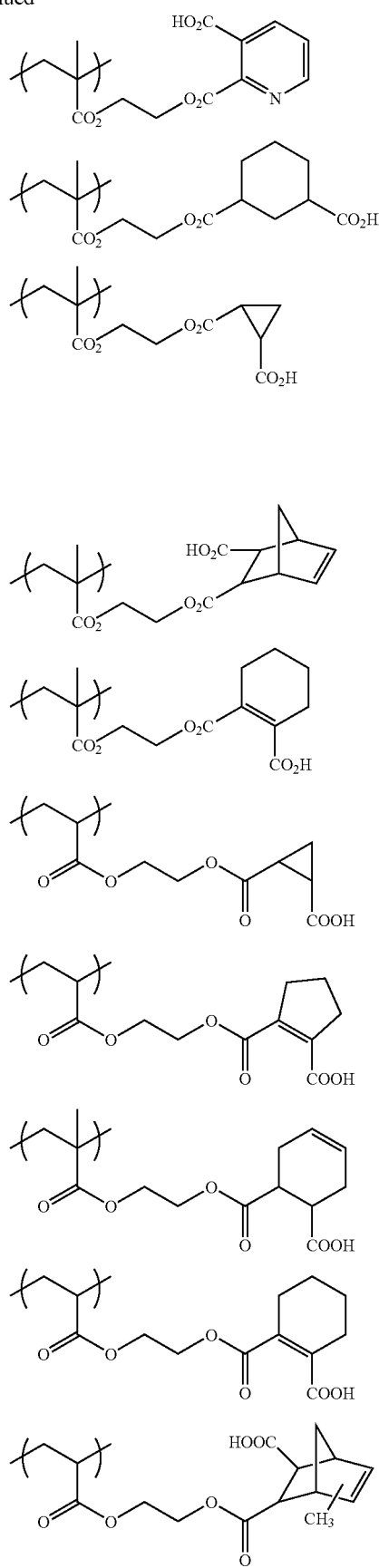

33
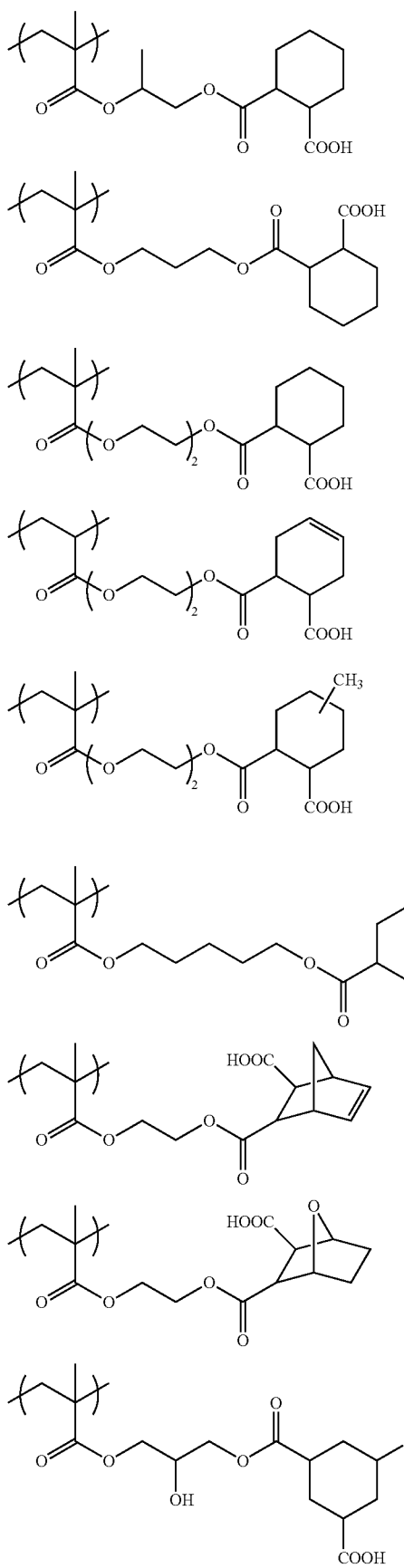
34
-continued
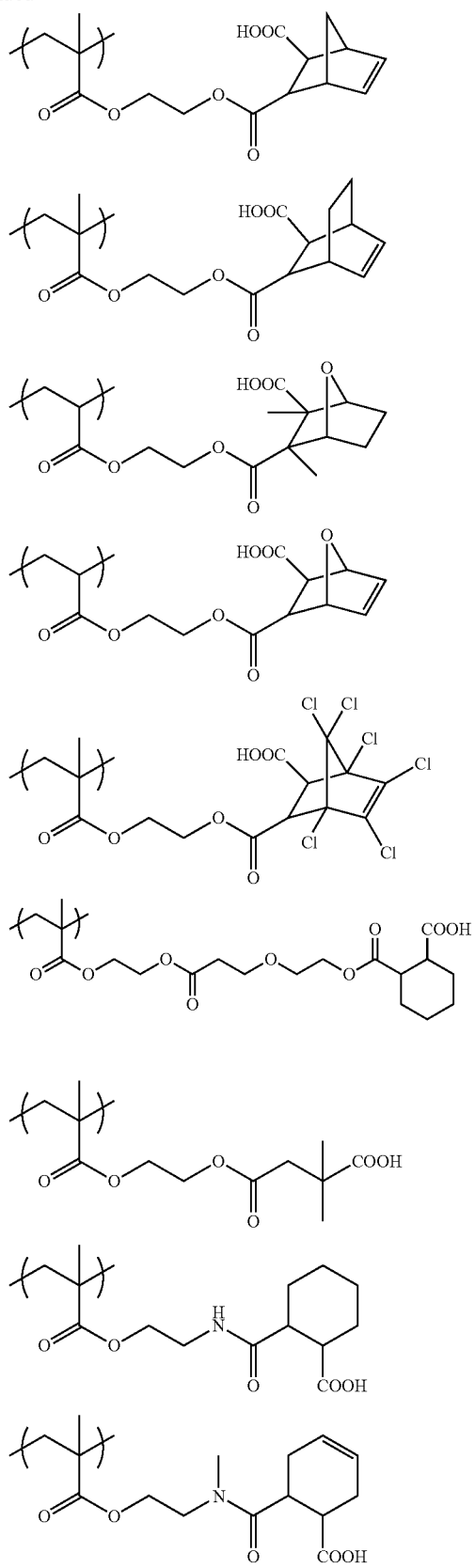

35
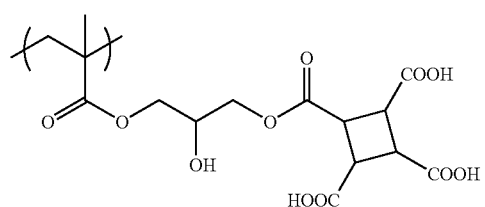
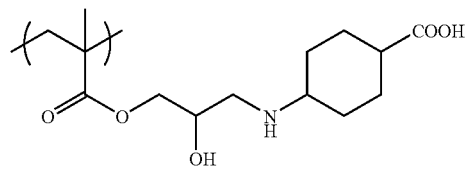
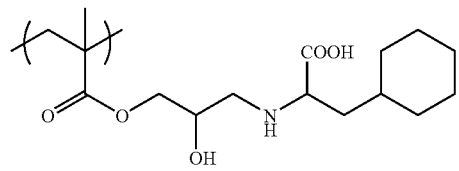
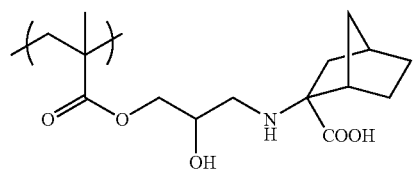
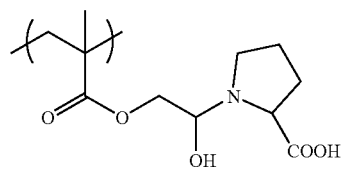
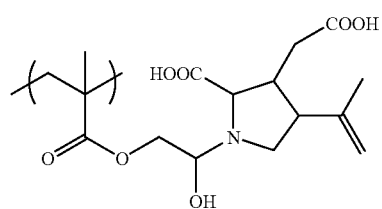
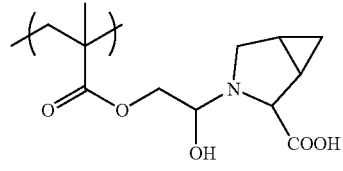
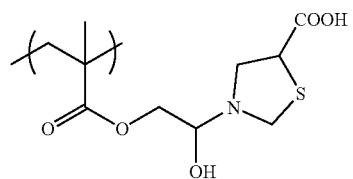
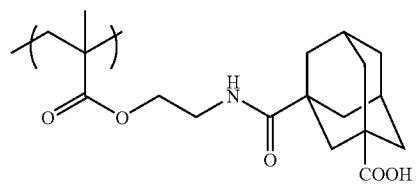
36
-continued
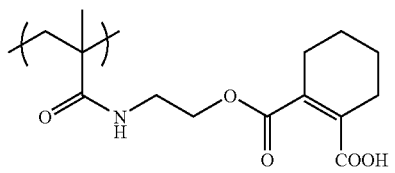
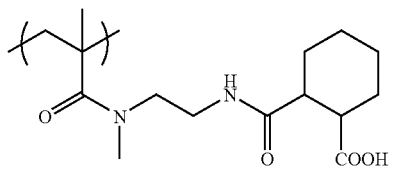
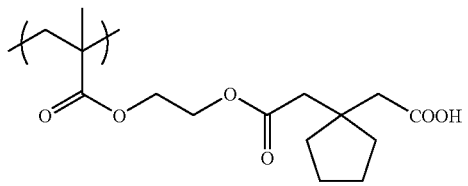
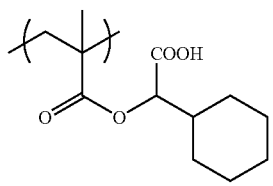
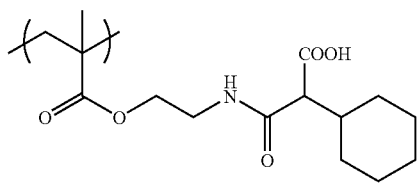
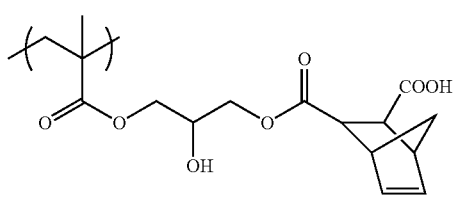
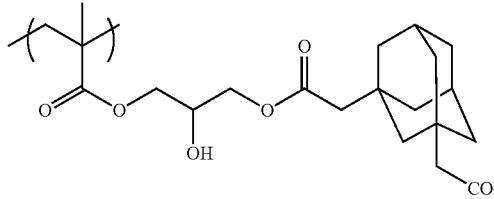
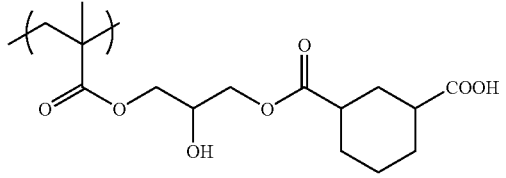
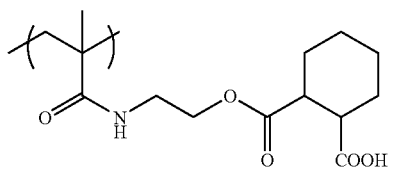

37
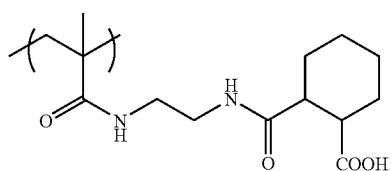
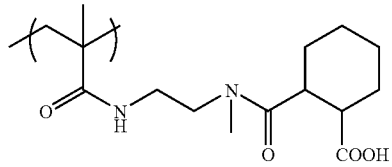
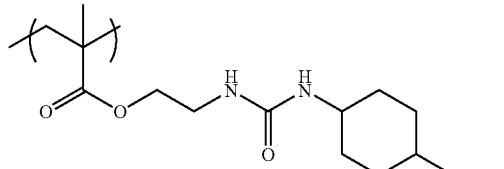
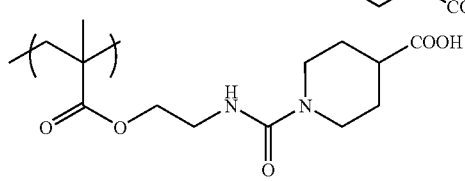
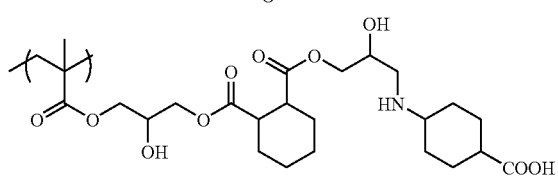
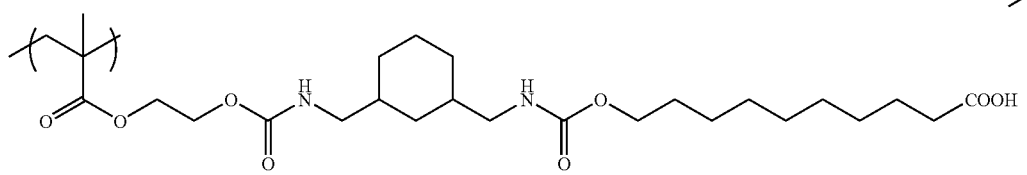
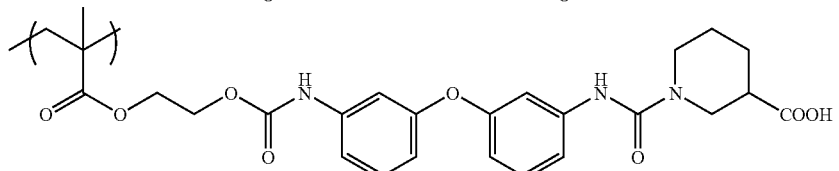
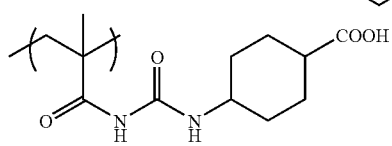
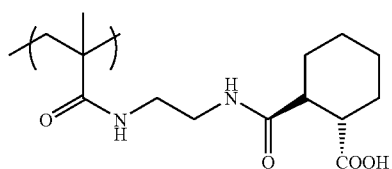
38
-continued
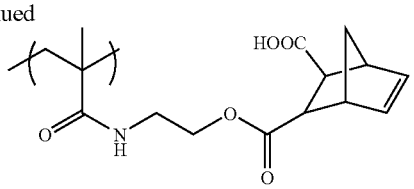
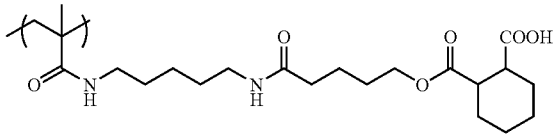
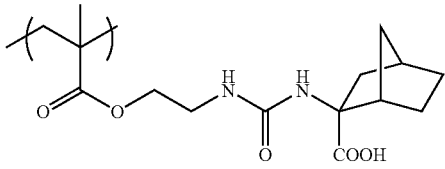
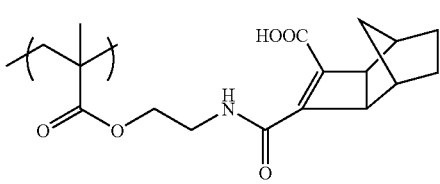
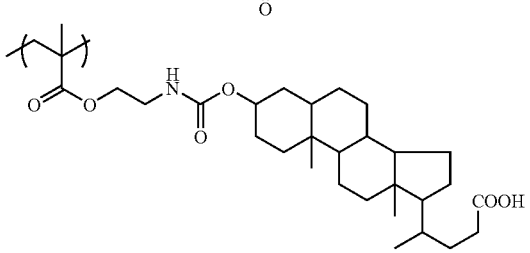
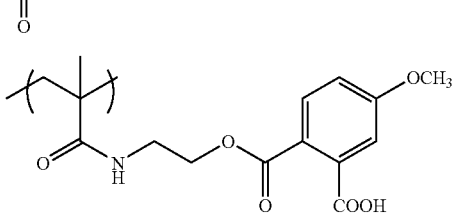
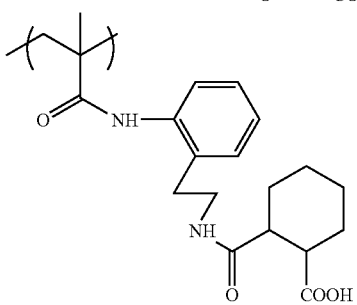

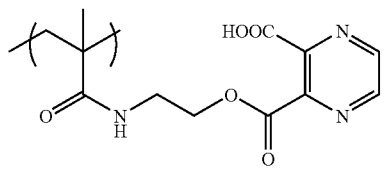

The binder polymer may have either one type of the repeating unit represented by the formula (I) or two or more different types thereof. Namely, although the binder polymer preferably employed in the invention may be a polymer exclusively composed of a repeating unit represented by the formula (I) it is a con practice to use a copolymer comprising the repeating unit together with another comonomer component. Although the total content of the repeating unit represented by the formula (I) in such a copolymer may be appropriately determined depending on the structure thereof, the design of the polymerizable composition and so on, it preferably ranges from 1 to 90% by mol, still preferably from 5 to 40% by mol and still preferably from 5 to 20% by mol, based on the total amount by mol of the polymer components.

As the comonomer component to be used in the copolymer, any publicly known one is usable without restriction, so long as it can undergo radical polymerization. As specific examples thereof, monomers listed in *Kobunshi Deta Handobukku-Kisohen-*, (ed. by The Society of Polymer Science, Baifukan, 1986). Either one of such comonomers or a combination of two or more thereof may be used.

Among the binder polymers as described above, [allyl (meth)acrylate/(meth)acrylic acid/(if needed) another addition-polymerizable vinyl monomer] copolymers, polymers having an acryl group, a methacryl group and an allyl group as described in JP-A-2000-131837, JP-A-2002-62648, JP-A-2000-187322 and Japanese Patent Application 2002-287920 as described above, etc. are excellent in the balance among film strength, sensitivity and development characteristics and, therefore, adequately usable.

Among all, a polymer comprising the repeating unit represented by the foregoing formula (I) and a radical-polymerizable group (carbon-carbon double bond) with the structure represented by the following formulae (II) to (IV) is the most desirable.

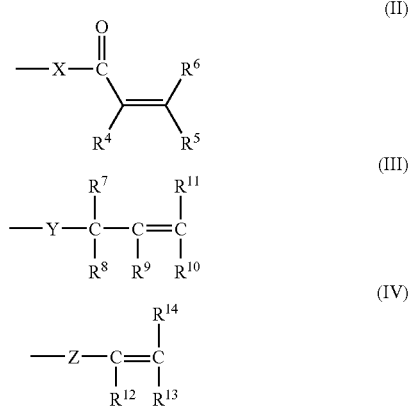

In formulae (II) to (IV), $R^4$ to $R^{14}$ each independently represent a hydrogen atom or a monovalent substituent; X and Y each independently represent an oxygen atom, a sulfur atom or —N—$R^{15}$; and Z represents an oxygen atom, a sulfur atom, —N—$R^{15}$ or a phenylene group wherein $R^{15}$ represents a hydrogen atom or a monovalent organic group.

In the formula (II), $R^4$ to $R^6$ each independently represent a hydrogen atom or a monovalent substituent wherein as $R^4$, a hydrogen atom, or organic groups including an alkyl group occasionally having a substituent are mentioned, and specifically among them, a hydrogen atom, methyl, methylalkoxy and methyl ester groups are preferred. Further, $R^5$ and $R^6$ each independently represent a hydrogen atom, a halogen atom, an amino group, a dialkylamino group, a carboxyl group, an alkoxycarbonyl group, sulfo group, nitro group, cyano group, an alkyl group that may have a substituent, an aryl group that may have a substituent, an alkoxy group that may have a substituent, an aryloxy group that may have a substituent, an alkylamino group that may have a substituent, an arylamino group that may have a substituent, an alkylsulfonyl group that may have a substituent, an arylsulfonyl group that may have a substituent, etc. are mentioned. Among these, a hydrogen atom, a carboxyl group, an alkoxycarbonyl group, an alkyl group that may have a substituent and an aryl group that may have a substituent are preferred.

The substituent that may be introduced in these groups includes methoxycarbonyl group, ethoxycarbonyl group, isopropioxycarbonyl group, methyl group, ethyl group, phenyl group, etc.

X represents an oxygen atom, a sulfur atom or —N—$R^{15}$ wherein $R^{15}$ represents an alkyl group that may have a substituent.

In the foregoing formula (III), $R^7$ to $R^{11}$ each independently represent a hydrogen atom or a monovalent substituent wherein, as $R^7$ to $R^{11}$, for example, a hydrogen atom, a halogen atom, an amino group, a dialkylamino group, carboxyl group, an alkoxycarbonyl group, sulfo group, nitro group, cyano group, an alkyl group that may have a substituent, an aryl group that may hare a substituent, an alkoxy group that may have a substituent, an aryloxy group that may have a substituent, an alkylamino group that may have a substituent, an arylamino group that may have a substituent, an alkylsulfonyl group that may have a substituent, and an arylsulfonyl group that may have a substituent, etc. are preferred. Among these, a hydrogen atom, carboxyl group, an alkoxycarbonyl group, an alkyl group that may have a substituent and an aryl group that may have a substituent are preferred.

The substituent that may be introduced in these groups includes, for example, those mentioned as introducible in formula (II).

Y represents an oxygen atom, a sulfur atom or —N—$R^{15}$ wherein $R^{15}$ represents the same groups as in formula (II).

In the foregoing formula (IV), $R^{12}$ to $R^{14}$ each independently represent a hydrogen atom or a monovalent substituent, and specifically, for example, a hydrogen atom, a halogen atom, an amino group, a dialkylamino group, carboxyl group, an alkoxycarbonyl group, sulfo group, nitro group, cyano group, an alkyl group that may have a substituent, an aryl group that may have a substituent, an alkoxy group that may have a substituent, an aryloxy group that may have a substituent, an alkylamino group that may have a substituent, an arylamino group that may have a substituent, an alkylsulfonyl group that may have a substituent, and an arylsulfonyl group that may have a substituent, etc. are preferred. Among these, a hydrogen atom, carboxyl group, an alkoxycarbonyl group, an alkyl group that may have a substituent and an aryl group that may have a substituent are preferred.

The substituent that may be introduced in these groups includes, for ale, those mentioned as introducible in formula (II).

Z represents an oxygen atom, a sulfur atom, —N—$R^{15}$ or phenylene group wherein $R^{15}$ represents the same groups as in formula (II).

Among these radical-polymerizable groups, those having the structures represented by the foregoing formulae (II) and (III) are preferred.

Further, as other examples of the binder polymer, urethane-based binder polymers having an acid group described in JP-B-7-12004, JP-B-7-120041, JP-B-7-120042, JP-B-8-12424, JP-A-63-287944, JP-A-63-287947, JP-A-1-271741, Japanese Patent Application 10-116232, etc. are excellent in strength and, therefore, advantageous in printing durability and the adaptability to low exposure doses.

Furthermore, a binder having an amide group as set forth in JP-A-11-171907 is excellent both in development characteristics and film strength. Therefor, this binder is also applicable to the invention.

In addition to those cited above, polyvinylpyrrolidone, polyethylene oxide, etc. are useful as a water-soluble linear organic polymer. To elevate the strength of a hardened film, alcohol-soluble nylons, a polyether comprising 2,2-bis-(4-hydroxyphenyl)-propane and epichlorohydrin, etc. are also useful. Such a linear organic high-molecular weight polymer may be added to the overall position in an arbitrary amount. However, it is undesirable that the content thereof exceeds 90% by mass, since unfavorable results are attained on the strength of the resultant image, etc. The content thereof preferably ranges from 30 to 85% by mass. The ratio by mass of the polymerizable compound (B), which will be described hereinafter, to the linear organic high-molecular weight polymer preferably ranges from 1/9 to 7/3, Each of such binder polymers may be used individually or in combinations of two ox more thereof.

The molecular weight of the binder polymer (A) in the invention, which is appropriately determined from the viewpoints of image-forming capability as well as printing durability, is, in many cases, preferably in the range of from 2,000 to 1,000,000 more preferably from 5.0 to 5,000, and still more preferably from 10,000 to 200,000.

As the binder polymer (A) in the invention, us is mad of one which is substantially insoluble in water but soluble in an aqueous alkali solution. Thus, an organic solvent which is undesirable from environmental viewpoint needs not be used, or is used only in a highly restricted amount as a developing solution. The acid value (i.e., the acid content per gram of the polymer expressed in stoichiometric number) of the binder polymer may be appropriately selected from the viewpoints of image strength and development characteristics. It is preferable that the acid value ranges from 0.4 to 3.0 meq/g while the molecular weight ranges from 2000 to 500,000. It is more preferable that the acid value ranges from 0.6 to 2.0 me/g while the molecular weight ranges from 10,000 to 300,000.

(B) Compound Having Polymerizable Unsaturated Group

The polymerizable composition according to the invention or the recording layer of the lithographic printing plate precursor according to the invention contains a compound having a polymerizable unsaturated group ((hereinafter optionally referred to as "a polymerizable compound").

It is preferable that the polymerizable compound to be used in the invention is an addition-polymerizable compound having at least one ethylenically unsaturated double bond. It is preferable that the polymerizable compound is selected from the group consisting of compounds having at least one, preferably two or more terminal ethylenically unsaturated bonds. Such compounds, which have been widely known in the art, can be employed in the invention without specific restriction. These compounds involve those having chemical forms, for example, monomers, prepolymers (i.e., dimers, termers and oligomers), mixtures thereof and copolymers thereof.

Examples of the monomers and copolymers include unsaturated carboxylic acids (for example, acrylic acid, methacrylic acid, itaconic acid, crotonic acid, isocrotonic acid, maleic acid, etc.), esters thereof and amides thereof. It is preferable to use unsaturated eaters of carboxylic acids with aliphatic polyhydric alcohols and amides of unsaturated carboxylic acids with aliphatic polyvalent amine compounds. Moreover, use may be appropriately made of addition reaction products of unsaturated carboxylic acid esters or amides having a nucleophilic substituent such as a hydroxyl group, an amino group or a mercapto group with monofunctional or polyfunctional isocyanates or epoxy compounds, dehydro-condensation products thereof with monofunctional or polyfunctional carboxylic acids, etc.

In addition, it is also appropriate to use addition reaction products of unsaturated carboxylic acid esters or amides having an electrophilic substituent such as an isocyanate group or an epoxy group with monohydric or polyhydric alcohols, amides or thiols and substitution reaction products of unsaturated carboxylic acid esters or amides having a leaving substituent such as a halogen group or a tosyloxy group with monohydric or polyhydric alcohols, amines or thiols. As further examples, it is also possible to employ compounds prepared by substituting the unsaturated carboxylic acids as described above by unsaturated phosphonic acid, styrene, vinyl ether or the like.

As specific examples of the monomers of the esters of aliphatic polyhydric alcohol compounds with unsaturated carboxylic acids, citation may be made of acrylic acid esters, e.g., ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomers, etc.

Examples of methacrylic acid esters include tetramethylene glycol dimethacrylate, triethylene glycol dimethacrylate, neopentyl glycol dimethacrylate, trimethylolpropan trimethacrylate, trimethylolethan trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis [p-(methacryloxyethoxy)phenyl]dimethylmethane, etc.

Examples of itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate, sobritol tetraitaconate, etc.

Examples of crotonic acid esters include ethyleneglycol dicrotonate, tetramethylene glycol dicrotonate, pentaerythiritol dicrotonate, sorbitol tetracrotonate, etc.

Examples of isocrotonic acid esters include ethyleneglycol diisocrotonate, pentaerythritol diisocrotonate, sorbitol tetraisocrotonate, etc.

Examples of maleic acid esters include ethyleneglycol dimaleate, triethylene glycol dimaleate, pentaerythritol dimaleate, sorbitol tetramaleate, etc.

As there examples of the esters, us may be appropriately made of aliphatic alcohol type esters described in JP-B-46-27926, JP-B-51-47334 and JP-A-57-196231, those having an aromatic skeleton described in JP-A-59-5240, JP-A-59-5241 and JP-A-2-226149, those having an amino group described in JP-A-1-165613, etc.

Furthermore, it is also possible to use mixtures of the ester monomers as described above.

Specific examples of the monomers of amides of aliphatic polyvalent amine compounds with unsaturated carboxylic acids include methylene bis-acrylamide, methylene bis-methacrylamide, 1,6-hexamethyelne bis-acrylamide, 1,6-hexamethyelne bis-methacrylamide, diethylenetriamine trisacrylamide, xylyene bisacrylamide, xylylene bis-methacrylamide, etc.

Other preferable examples of amide-type monomers include those having a cyclohexylene structure described in JP-B-54-21726.

Also, a urethane-based addition-polymerizable compound produced by using the addition reaction between isocyanate and a hydroxyl group can be appropriately used. Specific examples thereof include vinylurethane compounds having two or more polymerizable vinyl groups per molecule, which are obtained by adding a vinyl monomer having a hydroxyl group as represented by the following formula to a polyisocyanate compound having two or more isocyanate groups per molecule, as described in, for example, JP-B-48-41708.

In the above formula, R and R' independently represent each a hydrogen atom or $CH_3$.

Moreover, use may be appropriately made of urethane acrylates described in JP-A-51-37193, JP-9-2-32293 and JP-B-2-16765, urethane compounds having an ethylene oxide-type skeleton described in JP-B-58-49860, JP-B-56-17654, JP-B-62-39417 and JP-B-62-39418, etc.

Furthermore, heat-sensitive compositions having highly favorable hardening reaction speed can be obtained by using addition-polymerizable compounds having an amino structure or a sulfide structure in the molecule described in JP-A-63-277653, JP-A-63-260909 and JP-A-1-105238.

Additional examples of the polymerizable compound include polyester acrylates and polyfunctional acrylates and methacrylates such as epoxyacrylates obtained by reacting epoxy resins with (meth)acrylic acid which are described in JP-A-48-64138, JP-B-49-43191 and JP-B-52-30490. Furthermore, specific unsaturated compounds described in JP-B-46-43946, JP-B-1-40337 and JP-B-1-40336 and vinylphosphonic acid type compounds described in JP-A-2-25493 may be cited. In some cases, moreover, it is appropriate to use a structure having a perfluoroalkyl group as described in JP-A-61-22048. It is also possible to use light-hardening monomers and oligomers reported in *Nippon Secchaku Kyokai-shi*, vol. 20, No. 7, pp. 300-308 (1984).

Details in using such a polymerizable compound (i.e., it structure, either using alone or combinedly, the addition level, etc.) can be arbitrarily selected depending on the design of the performance of the sensitive material obtained as the final product. For ale, selection may be made from the following viewpoints. Concerning the photosensitization speed, it is preferable to cloy a structure containing much unsaturated groups per molecule (preferably being bifunctional or higher in many cases). To elevate the strength in the image part (i.e., the hardened film), a trifunctional or higher compound is preferable. It is also effective to use a combination of compounds having different functional valencies and different polymerizable groups (for example, an acrylic acid ester, a methacrylic acid ester, a styrene-type compound and a vinyl ether-type compound) so as to control both of the photosensitivity and the strength. Although a compound having a high molecular weight and a highly hydrophobic compound are favorable from the viewpoint of photosensitization speed and film strength, these compounds are sometimes undesirable with respects to development speed and deposition from a developing solution.

Concerning the composition ratio of the polymerizable compound (B), a higher ratio is the better from the viewpoint of sensitivity. However, an excessively large content of the polymerizable compound (B) would result in undesirable phase separation, some problems in the production process due to the adhesiveness of the composition (for example, transfer of the sensitive components and troubles in the production due to adhesion), and deposition from a developing solution in the case of producing a lithographic printing plate precursor. From these points of view, it is preferable that the content of the component (B) in the polymerizable composition according to the invention, or in the recording layer of the lithographic printing plate precursor according to the invention, ranges from 20 to 70% by mass, still preferably from 25 to 50% by mass, based on the total solid components.

Either one polymerizable compound (B) or two or more thereof may be used.

In the case of using in a lithographic printing plate precursor, it is highly important to select an appropriate polymerizable compound and an appropriate method of using the same while taking the compatibility and dispersibility thereof with other components (for example, a binder polymer, an initiator, a colorant and so on) to be used in the recording layer into consideration. For example, the compatibility can be improved in some cases by using a compound having a low purity or a combination of two or more compounds.

(D) Compound Having Absorption Maximum at 700 to 1200 nm

From the viewpoint of elevating sensitivity, it is preferable that the polymerizable composition according to the invention or the recording layer of the lithographic printing plate precursor according to the invention contains a compound having an absorption maximum at 700 to 1200 nm. Addition of such a compound imparts to the polymerizable composition according to the invention a sensitivity to the infrared wavelength range.

From the viewpoint of the compatibility with highly available high power lasers, it is preferable to use an infrared absorbing dye or pigment having an absorption maximum at 700 to 1200 nm as the compound having an absorption maximum at 700 to 1200 nm.

As the dye, use can be made of commercially available dyes and publicly known ones described in documents, for example, *Senryo Binran* (ed. by The Society of Synthetic Organic Chemistry, Japan, 1970), etc. Specific examples thereof include azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, sqarylium dyes, pyrilium salts, metal thiolate complexes, oxonol dyes, diimonium dyes, aminium dyes, criconium dyes and so on.

Examples of preferable dyes include cyanine dyes described in JP-A-58-125246, JP-A-59-84356, JP-A-59-202829, JP-A-60-78787, etc., methine dyes described in JP-A-58-173696, JP-A-58-181690, JP-A-58-194595, etc., naphthoquinone dyes described in JP-A-58-112793, JP-A-58-224793, JP-A-59-48187, JP-A-59-73996, JP-A-60-52940, JP-A-60-63744, etc., squarylium dyes described in JP-A-58-112792, etc., cyanine dyes described in British Patent 434,875, and so on.

Further, it is appropriate to use a near infrared absorbing sensitizer described in U.S. Pat. No. 5,156,938. Furthermore, use can be preferably made of substituted arylbenzo (thio) pyrilium salts described in U.S. Pat. No. 3,881,924, trimethine thiapyrilium salts described in JP-A-57-142645 (U.S. Pat. No. 4,327,169), pyrilium compounds described in JP-A-58-181051, JP-A-58-220143, JP-A-59-41363, JP-A-59-84248, JP-A-59-84249, JP-A-59-146063 and JP-A-59-146061, cyanine colorants described in JP-A-59-216146, pentamethine thiopyrilium salts described in U.S. Pat. No. 4,283,475 and pyrilium compounds described in JP-B-5-13514 and JP-B-5-19702.

As preferable examples of the dye, it is also possible to cite near infrared absorbing dyes represented by formulae (I) and (II) in U.S. Pat. No. 4,756,993.

Among these dyes, particularly preferable examples include cyanine colorants, phthalocyanine dyes, oxonol dyes, squarylium dyes, pyrilium dyes, thiopyrilium dyes and nickel thiolate complexes. Dyes represented by the following formula (a) to the formula (e) are still preferable because of being excellent in sensitivity. In particular, canine colorants represented by the following formula (a) are most desirable, since they impart high polymerization activity and are excellent in stability and economical properties in the case of using in the recording layer according to the invention.

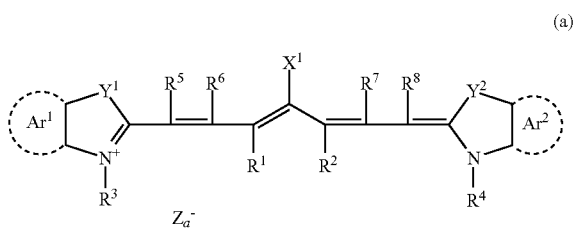

(a)

In the formula (a), $X^1$ represents a hydrogen atom, a halogen atom, —NAr$^x_2$, $X^2$-L$^1$ or a group as will be described hereinafter. $X^2$ represents an oxygen atom, a sulfur atom or —N(R$^x$)— wherein R$^x$ represents a hydrogen atom or a hydrocarbon group having from 1 to 10 carbon atoms, while L$^1$ represents a hydrocarbon group having 1 to 12 carbon atoms, an aromatic ring having a hetero atom or a hydrocarbon group containing a hetero atom and having 1 to 12 carbon atoms. Ar$^x$ represents a substituted or unsubstituted aromatic hydrocarbon group having from 6 to 14 carbon atoms, and examples of the substituent for the aromatic hydrocarbon group includes a halogen atom, an alkyl group, an aryl group, an alkenyl groups, alkynyl groups, a cyano group, a carboxy group, a nitro group, an amido group, an ester group, an alkoxy group, an amino group, and a heterocyclic group.

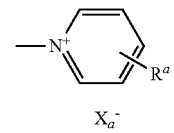

$X_a^-$ is the same as the definition of $Z_a^-$ in the formula (a) as described below. $R^a$ represents a hydrogen atom, an alkyl group, aryl group, a substituted or unsubstituted amino group, or halogen atom.

$R^1$ and $R^2$ independently represent each a hydrocarbon group having 1 to 12 carbon atoms. Taking the storage stability of a coating solution for the photosensitive layer into consideration, it is preferable that $R^1$ and $R^2$ are each a hydrocarbon group having 2 or more carbon atoms. It is still preferable that $R^1$ and $R^2$ are bonded to each other to form a 5-membered ring or a 6-membered ring.

$Ar^1$ and $Ar^2$ may be either the same or different and each represents an optionally substituted aromatic hydrocarbon group. Preferable examples of the aromatic hydrocarbon group include a benzene ring and a naphthalene ring. Preferable examples of the substituent include hydrocarbon groups having 12 or less carbon atom, halogen atoms and alkoxy groups having 12 or less carbon atoms. $Y^1$ and $Y^2$ may be either the same or different and each represents a sulfur atom or a dialkylmethylene group having 12 or less carbon atoms. $R^3$ and $R^4$ may be either the sate or different and each represents an optionally substituted hydrocarbon group having 20 or less carbon atoms. Preferable examples of the substituent include alkoxy groups having 12 or less carbon atoms, a carboxyl group and a sulfo group. $R^5$, $R^6$, $R^7$ and $R^8$ may be either the same or different and each represents a hydrogen atom or a hydrocarbon group having 12 or less carbon atoms. From the viewpoint of the availability of starting materials, a hydrogen atom is favorable. $Za^-$ represents a counter anion. However, $Za^-$ in unnecessary in the case where any of $R^1$ to $R^8$ is substituted by a sulfo group. From the viewpoint of the storage stability of a coating solution for the recording layer, preferable examples of $Za^-$ include a halogen ion, a perchlorate ion, a tetrafluoroborate ion, a hexafluorophosphate ion and a sulfonate ion. In particular, a perchlorate ion, a hexafluorophosphate ion and an arylsulfonate ion are preferable therefor.

Specific examples of the cyanine colorants represented by the formula (a) which are appropriately usable in the invention include these as will be cited hereinafter as well as those described in paragraphs [0017] to [0019] in JA-2001-133969, paragraphs [0012] to [0038] in JP-A-2002-40638, and paragraphs [0012] to [0023] in JP-A-2002-23360.

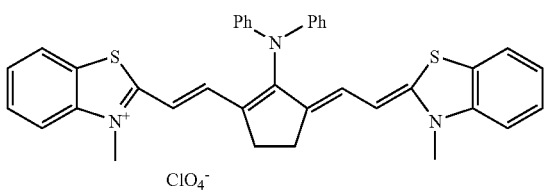

47
-continued
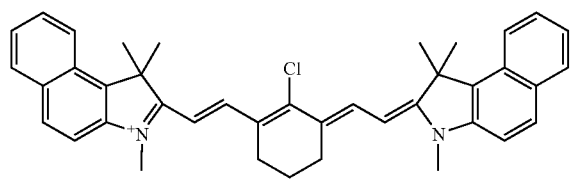
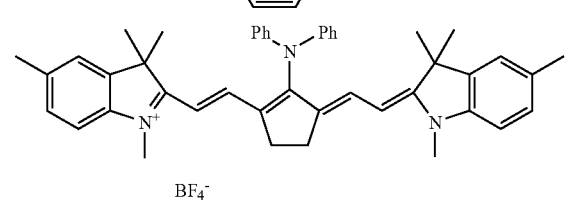
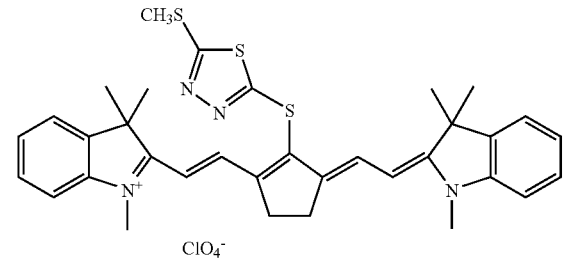
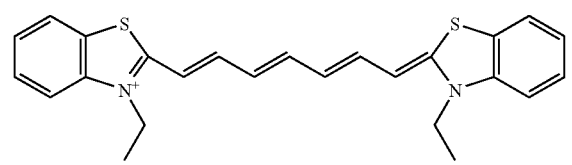
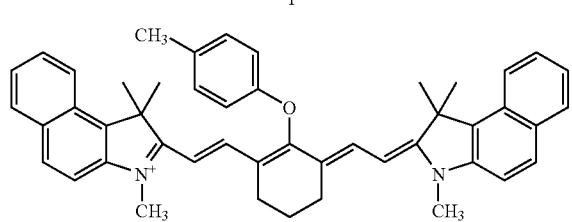
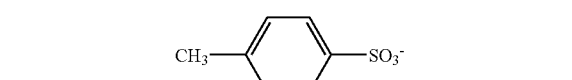
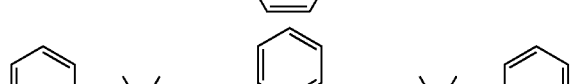
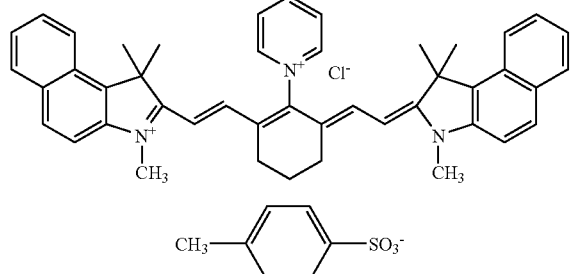
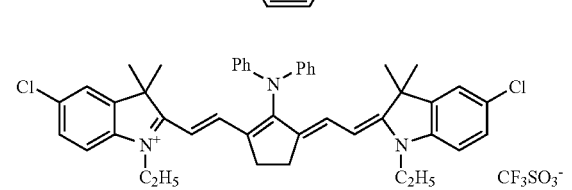
48
-continued
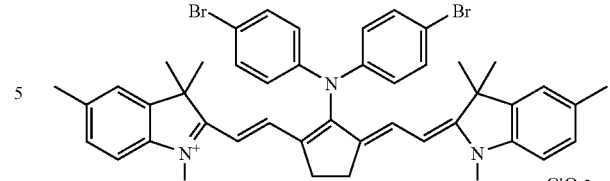
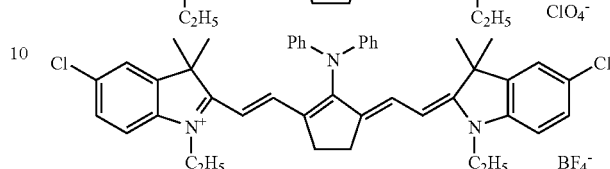
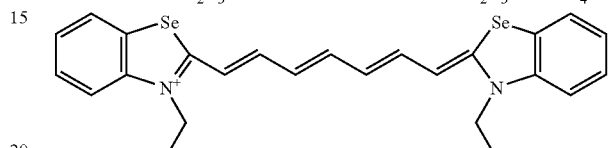
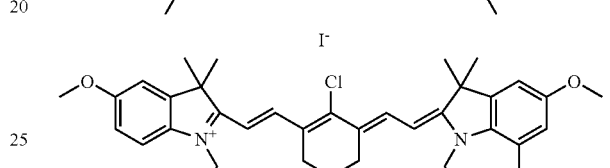
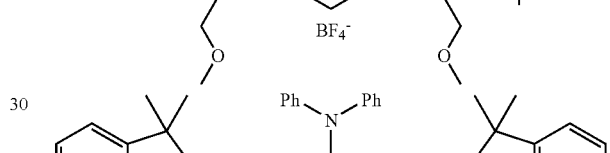
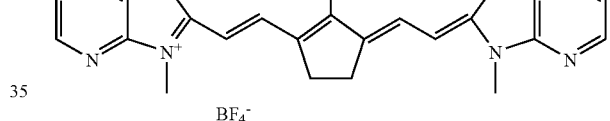
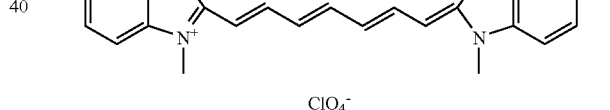
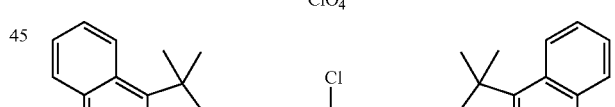
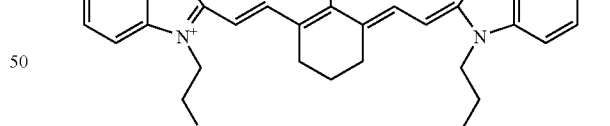
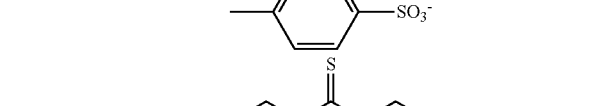
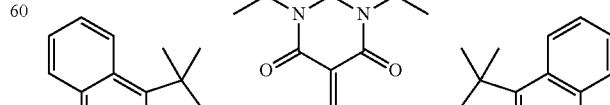
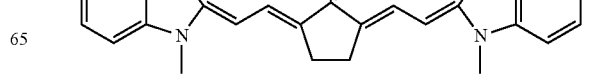

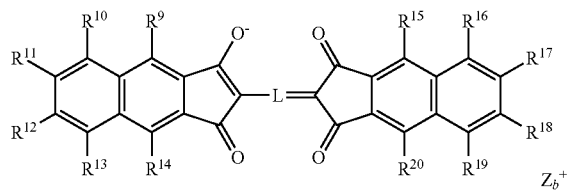
(b)

In the formula (b), L represents a methine chain having 7 or more conjugated carbon atoms. This methine chain may have substituents which may be bonded to each other to form a cyclic structure. $Z_b^+$ represents a counter cation. Preferable examples of the counter cation include ammonium, iodonium, sulfonium, pyridinium, alkali metal cations ($Na^+$, $K^+$, $Li^+$) and the like. $R^9$ to $R^{14}$ and $R^{15}$ to $R^{20}$ independently represent each a hydrogen atom or a halogen atom, a substituent selected from among a cyano group, alkyl groups, aryl groups, alkenyl groups, alkynyl groups, a carbonyl group, a thio group, a sulfonyl group, a sulfinyl group, an oxy group and an amino group, or a combination of two or three of these substituents which may be bonded to each other to form a cyclic structure. From the viewpoints of availability and effects, a compound represented by the above formula (b) wherein L represents a methine chain having 7 conjugated carbon atoms and $R^9$ to $R^{14}$ and $R^{15}$ to $R^{20}$ all represent hydrogen atoms is preferable.

Specific examples of the dyes represented by the formula (b) which are appropriately usable in the invention include the following ones.

In the formula (c), $Y^3$ and $Y^4$ represent each an oxygen atom, a sulfur atom, a selenium atom or a tellurium atom. M represents a machine atom having 5 or more conjugated carbon atoms. $R^{21}$ to $R^{24}$ and $R^{25}$ to $R^{28}$ may be either the same or different and each represents a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group. In this formula, $Za^-$ represents a counter anion the definition of which is the same as the definition of $Za^-$ in the formula (a) as described above.

Specific examples of the dyes represented by the formula (c), which are appropriately usable in the invention, are the following ones.

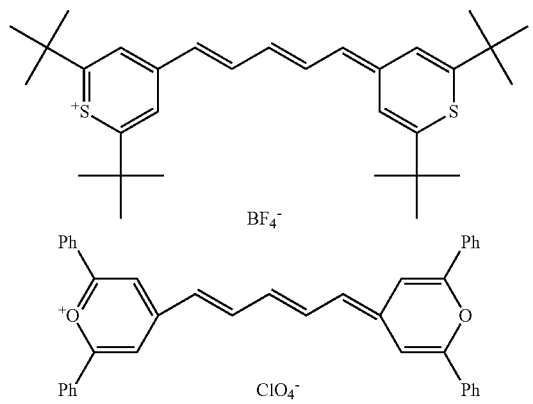

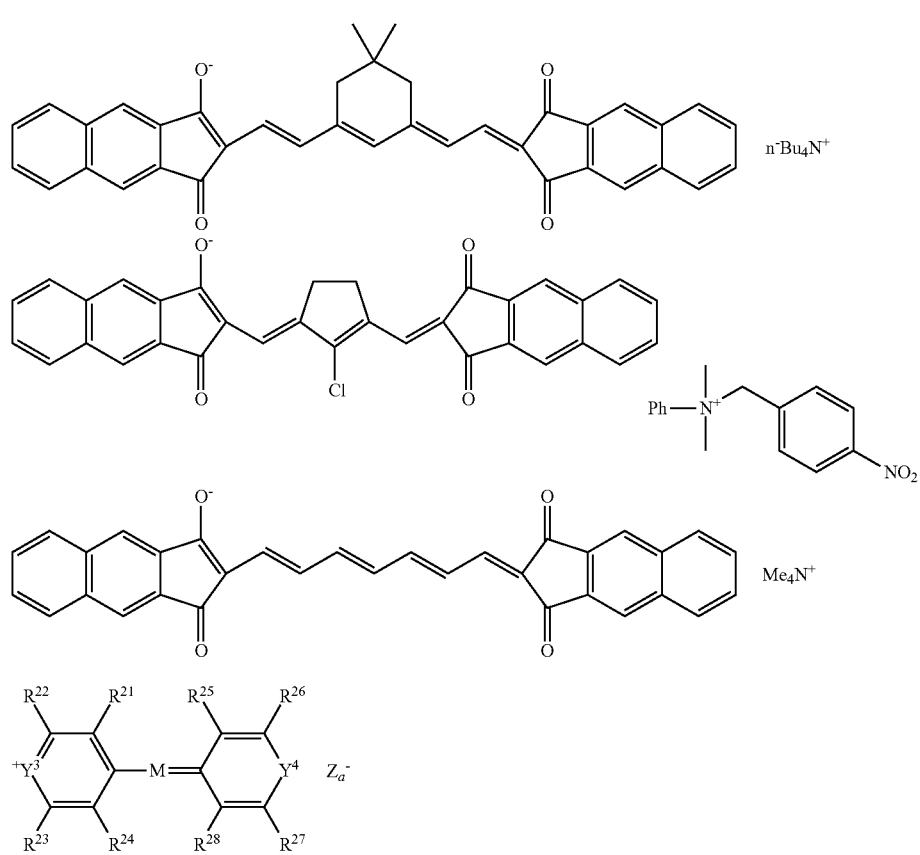

(c)

-continued

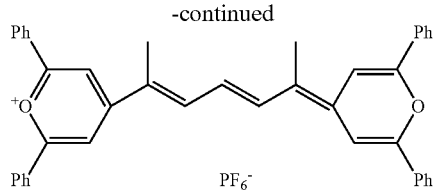

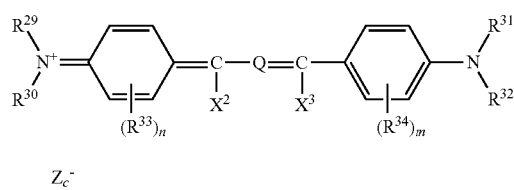

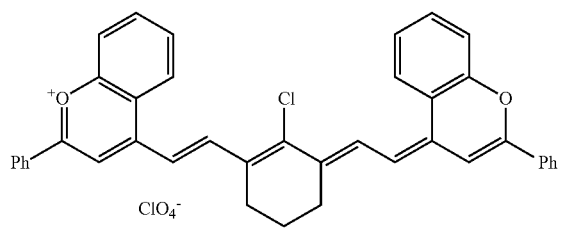

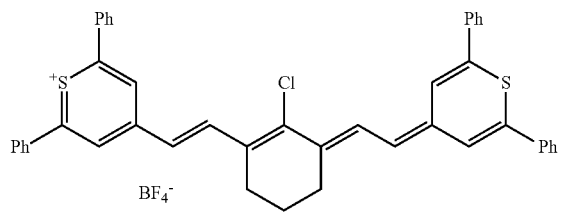

(d)

Specific examples of the dyes represented by the formula (d), which are appropriately usable in the invention, are as follows.

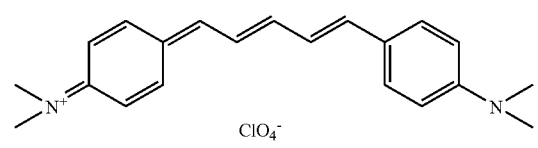

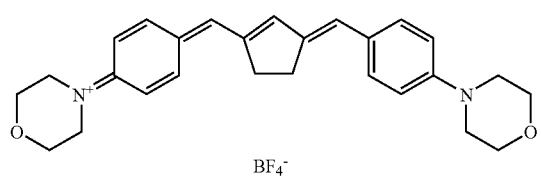

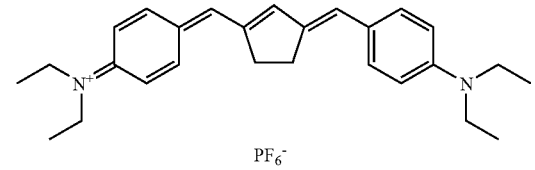

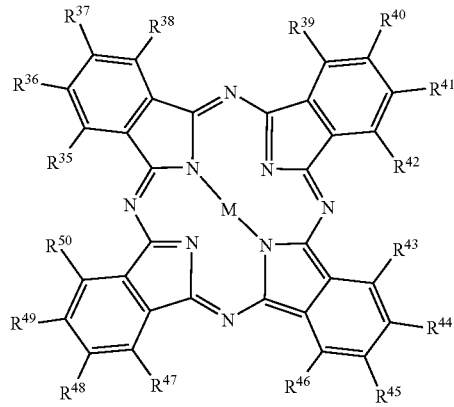

(e)

In the formula (d), $R^{29}$ to $R^{31}$ independently represent each a hydrogen atom, an alkyl group or an aryl group. $R^{33}$ and $R^{34}$ independently represent each an alkyl group, a substituted oxy group or a halogen atom. n and n independently represent each an integer of from 0 to 4. $R^{29}$ and $R^{30}$ or $R^{31}$ and $R^{32}$ may be bonded to each other to form a ring. Alternatively, $R^{29}$ and/or $R^{30}$ may be bonded to $R^{33}$, while $R^{31}$ and/or $R^{32}$ may be bonded to $R^{34}$ to form a ring. In the case where there are plural $R^{33}$'s or $R^{34}$'s, $R^{33}$'s or $R^{34}$'s may be bonded to each other to form a ring. $X^2$ and $X^3$ independently represent each a hydrogen atom, an alkyl group or an aryl group, provided that at least one of $X^2$ and $X^3$ represents a hydrogen atom or an alkyl group. Q represents an optionally substituted trimethine group or a pentamethine group which may form a cyclic structure together with a divalent organic group. $Zc^-$ represents a counter anion the definition of which is the same as the definition of $Za^-$ in the formula (a) as described above.

In the formula (e), $R^{35}$ to $R^{50}$ independently represent each an optionally substituted hydrogen atom, a halogen atom, a cyano group, a alkyl group, an aryl group, an alkenyl group, an alkynyl group, a hydroxyl group, a carbonyl group, a thio group, a sulfonyl group, a sulfinyl group, an oxy group, an amino group or an onium salt structure. M represents two hydrogen atoms or metal atoms, a halometal group or an oxymetal group. Examples of the metal atom contained therein include atoms of the IA, IIA, IIIB and IVB groups in the periodic table, transition atoms in the first, second and third periods and lanthanoid elements. Among all, copper, magnesium, iron, zinc, cobalt, aluminum, titanium and vanadium are preferable therefor.

Specific examples of the dyes represented by the formula (e), which are appropriately usable in the invention, are as follows.

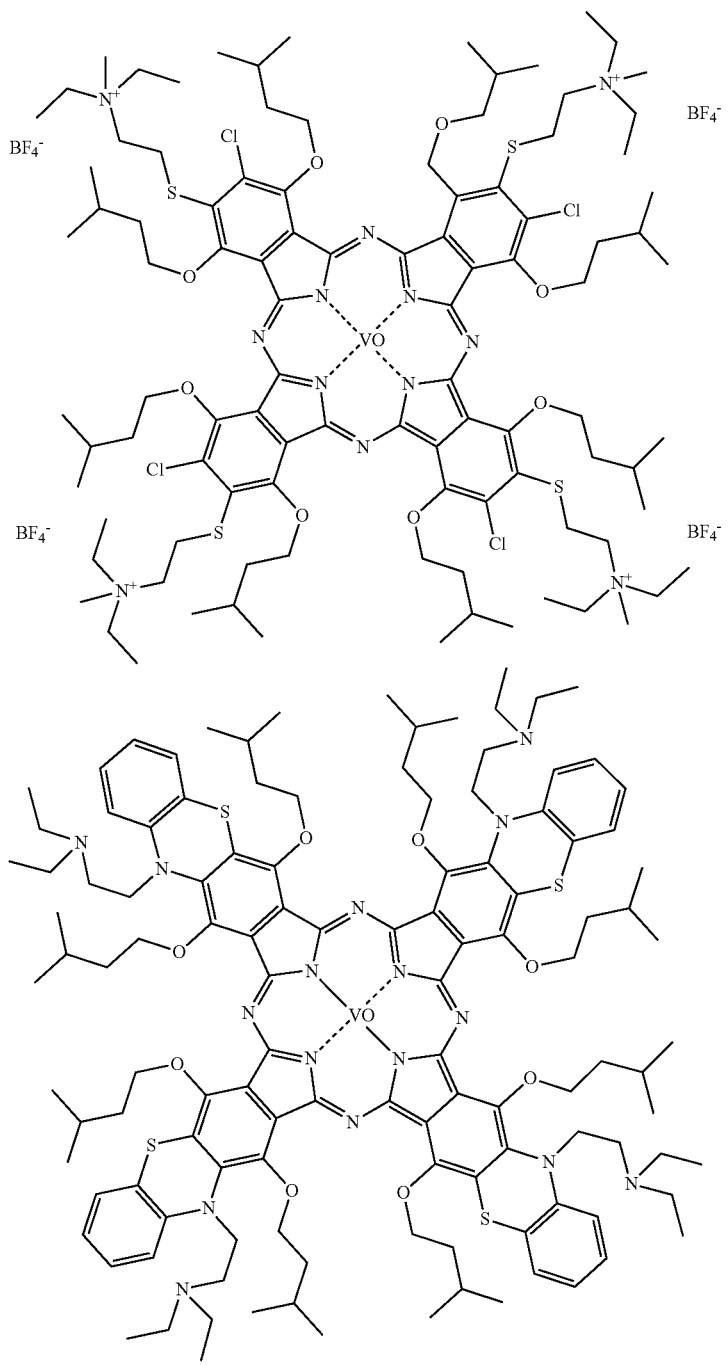

As examples of the pigment to be used as the component (D) in the invention, commercially available pigments and pigments described in Color Index (C. I.) *Binran, Saishin Ganryo Binran* (ed. by Nippon Ganryo Gijutsu Kyokai, 1977), *Saishin Ganryo Oyo Gijutsu* (CMC Shuppan, 1986) and *Insatsu Inki Gijutsu* (CMC Shuppan, 1984) may be cited.

Concerning the types of the pigments, use can be made of black pigments, yellow pigments, orange pigments, brown pigments, red pigments, purple pigments, blue pigments, green pigments, fluorescent pigments, metallic powder pigments, and polymer-binding pigments. More specifically speaking, use can be made of azo pigments, azo lake pigments, condensed azo pigments, chelate azo pigments, phthalocyanine-type pigments, anthraquinone-type pigments, perylene and perylene-type pigments, thioindigo-type pigments, quinacridone-type pigments, dioxazine-type pigments, isoindolinone-type pigments, quinophthalone-type pigments, underglaze lake pigments, azine pigments, nitroso pigments, nitro pigments, natural pigments, fluorescent pigments, inorganic pigments, carbon black and so on. Among these pigments, carbon black is preferred.

Such a pigment may be used without any surface treatment. Alternatively, it may be surface-treated before using. As the surface-treatment method, a method of coating the surface with a resin or a wax, a method of attaching a surfactant, a method of bonding a reactive substance (for example, a silane coupling agent, an epoxy compound, a polyisocyanate or the like) to the surface of the pigment, etc. may be suggested. These surface-treatment methods are reported by *Kinzoku Seen no Seishitu to Oyo* (Saiwai Shobo), *Insatsu Inki Gijutsu* (CMC Shuppan, 1984) and *Saishin Ganryo Oyo Gijutsu* (CMC Shuppan, 1986).

The particle diameter of the pigment preferably ranges from 0.01 to 10 μm, still preferably from 0.05 to 1 μm and particularly preferably from 0.1 to 1 μm. It is undesirable, from the viewpoint of the stability of the dispersion in a coating solution of the image recording layer, that the particle diameter of the pigment is less than 0.01 μm. On the other hand, it is undesirable from the viewpoint of the uniformity of the image recording layer that the particle diameter thereof exceeds 10 μm.

To disperse the pigment, use can be made of a publicly known dispersion technique having been employed in producing inks, toners, etc. ales of a dispersing machine include an ultrasonic disperser, a sand mill, an attritor, a pearl mill, a super mill, a ball mill, an impeller, a disperser, a KD mill, a colloidmill, a dynatron, a three-roll mill, a pressure kneader and so on. Details are described in *Saishin Ganryo Oyo Gijutsu* (CMC Shuppan, 1986).

As the component (D) in the invention, use can be made of either one substance or a combination of two or more.

As the component (D) in the invention, it is preferable to use a cyanine colorant.

From the viewpoint of sensitivity, cyanine colorants represented by the formula (a) are still preferable. Among the cyanine colorants represented by the formula (a), cyanine colorants wherein $X^1$ is a diarylamino group or $X^2$-$L^1$ are preferable and cyanine colorants having a diarylamino group is still preferable.

Also, cyanine colorants having electron-attracting groups or heavy atom-containing substituents at the indolenine sites at both ends are preferable for example, those described in Japanese Patent Application 2001-6323 are appropriately employed. A cyanine colorant having a diarylamino group as $X^1$ and carrying electron-attracting groups at the indolenine sites at both ends is the most desirable one.

In the case of using the component (D) in the polymerizable composition according to the invention in the recording layer of a lithographic printing plate precursor, it is also preferable to add the component (D) in an amount of from 0.5 to 5% by mass based on the total solid components. When its content is lower than the addition level as specified above, the sensitivity of changes in the characteristics due to exposure is lessened and thus sufficient sensitization properties cannot be established. In the case of using the component (D) in excess, the uniformity and strength of the film would be worsened. Both of these cases are undesirable.

(Layer Constitution of Lithographic Printing Plate Precursor)

Next, the layer constitution in the case of using the polymerizable composition according to the invention as the recording layer of a lithographic printing plate precursor will be illustrated.

The lithographic printing plate precursor according to the invention has a recording layer, which contains at least the above-described (A) to (C), on a support. It may have other layers such as an intermediate layer and a protective layer, if necessary.

(Recording Layer)

Now, the recording layer having an image-forming function in the lithographic printing plate precursor according to the invention will be illustrated. The recording layer of the lithographic printing plate precursor according to the invention contains the above-described (A) to (C). From the viewpoint of elevating sensitivity, it is preferable that it contains (D) a compound having an absorption maximum at 700 to 1200 nm.

In the recording layer of the lithographic printing plate precursor according to the invention, the above-described component (C) saves, in particular, as a polymerization initiator which initiates and promotes the polymerization of the component (B), i.e., the polymerizable compound.

As the polymerizable compound (B) to be used in the recording layer of the lithographic printing plate precursor, use is made of a compound which has been described in detail in the above illustration of the component (B). To decide on an appropriate compound, it is also possible to select a specific structure while considering improvement in the adhesiveness to the support, overcoat layer, etc. which will be described hereinafter, in addition to the factors as stated above.

In the method of using the polymerizable compound, an appropriate structure, composition and addition level can be arbitrarily selected from the viewpoints of the degree of the polymerization inhibition to oxygen, resolution, fogging, change in refraction index, surface adhesiveness, etc. in some cases, it is also possible to employ the undercoating/overcoating constitution or method.

Although the above-described component (D) may be added together with other components to a composition to be used as the recording layer, it is also possible that a layer other than the recording layer is foamed and the component (D) is added thereto.

In forming the recording layer (film-forming) of the negative type lithographic printing plate precursor, it is preferable that the above-described component (D) has an optical density ranges from 0.1 to 0.3 at the absorption maximum of the recording layer within the wavelength range of from 760 to 1200 nm. In the case where the optical density does not fall within this range, the sensitivity is liable to lover. Since the optical density is determined depending on the addition level of the above-described component (D) and the thickness of the recording layer, a definite optical density can be achieved by controlling these factors. The optical density of the recording layer can be determined by a conventional method. Examples of the measurement method include a method wherein a recording layer having such a thickness as being appropriately determined within a range so as to give a coating dose after drying required as a lithographic printing plate is formed on a transparent or white support and the optical density thereof is measured with a scanning optical densitometer, and a method wherein a recording layer is formed on a reflective support made of aluminum etc. and the reflection density is measured.

(E) Other Components

The composition constituting the recording layer of the lithographic printing plate precursor according to the invention may further contain other components appropriate for the use, production process etc. Next, preferable additives will be illustrated.

(E-1) Cosensitizer

The sensitivity of the polymerizable composition can be further elevated by adding a certain additive thereto. Such compounds will be called cosensitizers hereinafter. Although the function mechanism thereof has not been clarified so far, it is considered that most of these cosensitizers would act, based on the following chemical process. That is to say, it is assumed that a cosensitizer reacts with various intermediate active species (radicals, cations) which are formed in the course of the photoreaction initiated by a thermal polymerization initiator and the following addition polymerization to give new active radicals. These cosensitizers may be roughly classified into: (i) those forming active radicals after reduction; (ii) those forming active radicals after oxidization; and (iii) those reacting with less active radicals to thereby convert them into more active radicals or acting as chain transfer agents. However, no common belief can be found out in many cases concerning the attributions of individual compounds.

(i) Compound Forming Active Radical after Reduction

Compound having carbon-halogen bond: it is considered that the carbon-halogen bond is reductively cleaved to give an active radical. More specifically speaking, trihalomethyl-s-triazines, trihalomethyl oxadiazoles etc. are appropriately usable.

Compound having nitrogen-nitrogen bond: it is considered that the nitrogen-nitrogen bond is reductively cleaved to give an active radical. More specifically speaking, hexaaryl biimidazoles etc. are appropriately usable.

Compound having oxygen-oxygen bond: it is considered that the oxygen-oxygen bond is oxidatively cleaved to give an active radical. More specifically speaking, organic peroxides etc. are appropriately usable.

Onium compound: it is considered that a carbon-hetero bond or an oxygen-nitrogen bond is reductively cleaved to give am active radical. More specifically speaking, diaryliodonium salts, triarylsulfonium salts, N-alkoxypyridinium (adinium) salts etc. are appropriately usable.

Ferrocene and iron-allene complex: an active radical mm be reductively foe.

(ii) Compound Forming Active Radical after Oxidization

Alkylate complex: it is considered that the carbon-hetero bond is oxidatively cleaved to give an active radical. More specifically speaking, triarylalkyl borates etc. are appropriately usable.

Alkylamine compound: it is considered that a C—X bond on carbon adjacent to nitrogen is cleaved due to oxidation to give an active radical. X preferably represents a hydrogen atom, a carboxyl group, a trimethylsilyl group, a benzyl group, etc. More specifically speaking, ethanolamine, N-phenylglycine, N-phenyl-imine diacetic acid and derivatives thereof, N-trimethylsilylmethylaniline etc. are appropriately usable.

Sulfur- or tin-containing compound: an active radical can be formed by the same mechanism as the one of the above-described amine but the nitrogen atom is substituted by a sulfur or tin atom. It is also known that a compound having an S—S bond has a sensitizing effect due to the S—S cleavage.

α-Substituted methylcarbonyl compound: an active radical can be formed by the cleavage of the carbonyl-α-carbon bond due to oxidation. Also, a compound wherein carbonyl is substituted by an oxime ether shows the same effect. More specifically speaking, 2-alkyl-1-[4-(alkylthio)phenyl]-2-morpholinopronones-1 and oxime ethers obtained by reacting them with hydroxyamines and etherifying N—OH can be cited.

Sulfinic acid salt: a radical can be reductively formed. More specifically speaking, sodium arylsulfinates can be cited.

(iii) Compound reacting with less active radical to thereby convert it into more active radical or acting as chain transfer agent: Use can be made of, for example, compounds having SH, PH, SiH or GeH. Such a compound donates hydrogen to a low active radical species to thereby form a radical. Alternatively, it is oxidized followed by the elimination of proton to thereby for a radical. More specifically speaking, 2-mercatptobenzimidazol can be cited.

It is also a preferable embodiment to incorporate a polycarboxylic acid compound having an aromatic ring or an aromatic hetero ring structure to which at least two carboxyl groups are attached directly or via a divalent linking group. Such polycarboxylic acid compound includes specifically, for example, (p-acetamidephenylimide)diacetic acid, 3-(bis(carboxymethyl)amino)benzoic acid, 4-(bis(carboxymethyl)amino)benzoic acid, 2-[(carboxymethyl)phenylamino]benzoic acid, 2-[(carboxymethyl)phenylamino]-5-methoxybenzoic acid, 3-[bis(carboxymethyl)amino]-2-naphtalenecarboxylic acid, N-(4-aminophenyl)-N-(carboxymethyl)glycine, N,N'-1,3-phenylenebisglycine, N,N'-1,3-phenylenebis[N-(carboxylmethyl)]glycine, N,N'-1,2-phenylenebis[N-(carboxylmethyl)]glycine, N-(carboxymethyl)-N-(4-methoxyphenyl)glycine, N-(carboxymethyl)-N-(3-methoxyphenyl)glycine, N-(carboxymethyl)-N-(3-hydroxyphenyl)glycine, N-(carboxymethyl)-N-(3-chlorophenyl)glycine, N-(carboxymethyl)-N-(4-bromophenyl)glycine, N-(carboxymethyl)-N-(4-chlorophenyl)glycine, N-(carboxymethyl)-N-(2-chlorophenyl)glycine, N-(carboxymethyl)-N-(4-ethylphenyl)glycine, N-(carboxymethyl)-N-(2,3-dimthylphenyl)glycine, N-(carboxymethyl)-N-(3,4-dimethylphenyl)glycine, N-(carboxymethyl)-N-(3,5-dimethylphenyl)glycine, N-(carboxymethyl)-N-(2,4-dimethylphenyl)glycine, N-(carboxymethyl)-N-(2,6-dimethylphenyl)glycine, N-(carboxymethyl)-N-(4-formylphenyl)glycine, N-(carboxymethyl)-N-ethylanthranilic acid, N-(carboxymethyl)-N-propylanthranilic acid, 5-bromo-N-(carboxymethyl)anthranilic acid, N-(2-carboxyphenyl)glycine, o-dianisidine-N,N,N',N'-tetraacetic acid, N,N'-[1,2-ethane-di-yl-bis(oxy-2,1-phenylene)]bis[N-(carboxymethyl)glycine, 4-carboxyphenoxyacetic acid, catechol-O,O'-diacetic acid, 4-methylcatechol-O,O'-diacetic acid, resorcinol-O,O'-diacetic acid, hydroquinone-O,O'-diacetic acid, α-carboxy-o-anisic acid, 4,4'-isopropylydenediphenoxyacetic acid, 2,2'-(dibenzofuran-2,8-di-yl-dioxy)diacetic acid, 2-(carboxymethylthio)benzoic acid, 5-amino-2-(carboxymethylthio)benzoic acid, 3-[(carboxymethyl)thio]-2-naphthalenecarboxylic acid, etc.

Among all, the N-arylpolycarboxylic acid represented by the following formula (V) and the compound represented by formula (VI) is preferred.

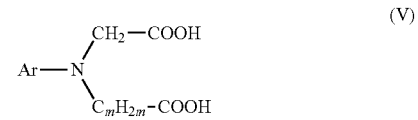

(V)

In formula (V) above, Ar represents a mono-, poly- or unsubstituted aryl group, and m represents an integer of 1 to 5.

Here, as the substituent introducible into the aryl group, an alkyl group of 1 to 3 carbon atoms, an alkoxy group of 1 to 3 carbon atoms, a thioalkyl group of 1 to 3 carbon atoms and a halogen atom are mentioned. The aryl group having from 1 to 3 substituents which are the same or different is preferred. m is preferably 1, and Ar is preferably phenyl.

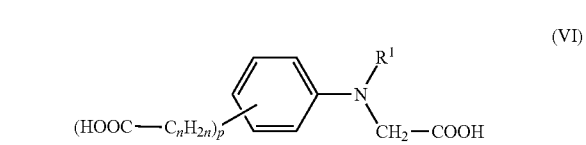

(VI)

In formula (VI) above, R¹ represents a hydrogen atom or an alkyl group with to 6 carbon atoms, and n and p each represent an integer of 1 to 5.

n is preferably 1, and R¹ is preferably a hydrogen atom. The most preferable polycarboxylic acid is anilinodiacetic acid.

In addition, as the preferable compound for the purpose of sensitivity increase and/or developing characteristics enhancement, those having either of a carboxylic acid group or a sulfonic acid group, or both of them in such a manner that the number of functional group is two or more are preferred. Specific compound examples include 5-aminoisophthalic acid, 5-nitroisophthalic acid, 4-methylphthalic acid, terephthalic acid, 2-bromoterephthalic acid, 2,3-naphthalenedicarboxylic acid, diphenic acid, 1,4,5,8-naphthalenetetracarboxylic acid, N-benzyliminodiacetic acid, N-(2-carboxyphenylglycine), N-phenyliminodiacetic acid, 1,3,5-benzenetricarboxylic acid, 1,2,4,5-benzenetetracraboxylic acid, 5-sulfosalicylic acid, 2-sulfobenzoic acid, 1,5-naphthalenedisulfonic acid, 4-sulfophthalic acid, etc. Further, the compounds enumerated above may be substituted with an alkyl group, an alkenyl group, an alkynyl group, cyano group, a halogen atom, hydroxy group, a carboxyl group, a carbonyl group, an alkoxy group, an amino group, an amide group, a thiol group, a thioalkoxy group or a sulfonyl group.

Among these compounds, the most preferable one is the compound represented by the aforementioned formula (V) or (VI). The added amount of such a poly(carboxylic/sulfonic acid) compound is preferably 0.5 to 15% by mass, more preferably 1 to 30% by mass, and particularly preferably 3 to 8% by mass based on the solid content of the polymerizable composition.

As more specific examples of these cosensitizers, a large number of compounds are described in for example JP-A-9-236913 as additives aiming at elevating sensitivity. These compounds are applicable to the invention.

Either one of these cosensitizers or a combination of two or more thereof can be employed. It is appropriate to use the cosensitizer in an amount of from 0.05 to 100 parts by mass, preferably from 1 to 80 parts by mass and still preferably from 3 to 50 parts by mass, per 100 parts by mass of the polymerizable compound (B) as described above.

(E-2) Polymerization Inhibitor

It is preferable in the invention to add a small amount of a thermal polymerization initiator, in addition to the fundamental components as described above, to inhibit the unnecessary thermal polymerization of the polymerizable compound daring the production or storage of the composition to be used in the recording layer. Appropriate examples of the thermal polymerization inhibitor include hydroquinone, p-methoxyphenol, di-t-butyl-p-cresol, pyrogallol, benzoquinone, 4,4'-thiobis(3-methyl-6-t-butylphenol), 2,2'-methylenebis(4-methyl-6-t-butylphenol), N-nitrosophenylhydroxyamine primary cerium salt, etc. It is preferable to add the thermal polymerization initiator in an amount of from about 0.01% by mass to about 5% by mass based on the mass of the whole composition. If necessary, a higher fatty acid derivative such as behenic acid or behenic acid amide, which is localized on the surface of the recording layer in the course of the coating on the support or the like and drying in the case of producing a lithographic printing plate precursor, may be added to prevent the enzymatic inhibition of the polymerization. It is preferable that the content of the higher fatty acid derivative ranges from about 0.5% by mass to about 10% by mass based on the whole composition.

(E3) Coloring Matter, Etc.

To color the recording layer, the lithographic printing plate precursor according to the invention may further contain a dye or a pigment. Thus, the so-called inspection properties as a printing plate such as the visibility after plate making and the suitability for an image density measurement machine can be improved. Since many dyes result in a decrease in the sensitivity of a thermal polymerization type recording layer, it is particularly preferable to use a pigment as the coloring matter. Specific examples thereof include pigments such as phthalocyanine pigments, azo pigments, carbon black and titanium oxide and dyes such as ethyl violet, crystal violet, azo dyes, anthraquinone dyes and cyanine dyes. It is preferable that a dye and a pigment are added in an amount of from about 0.5% by mass to about 5% by mass based on the whole composition.

(E-4) Other Additives

The lithographic printing plate precursor according to the invention may further contain other publicly known additives, for example an inorganic filler for improving the physical properties of a hardened film, a plasticizer, a fat-sensitizer for improving the fixation of an ink to the recording layer surface, etc.

Examples of the above-described plasticizer include dioctyl phthalate, didodecyl phthalate, triethylene glycol dicaprylate, dimethylglycol phthalate, triacresyl phosphate, dioctyl adipate, dibutyl sebacate, triacetyl glycerol, etc. In the case of using a binder, the plasticizer can be added in an amount of 10% by mass or less based on the sum of the masses of the compound having an ethylenically unsaturated double bond and the binder.

It is also possible to add an UV initiator, a heat crosslinking agent, etc. in order to enhance the effects of the heating and exposure to thereby improve the film strength (printing tolerance) as will be described hereinafter.

Moreover, it is possible to employ additives or form an intermediate layer in order to improve the adhesion between the recording layer and the support or to facilitate the development removal of the unexposed recording layer. For example, the adhesion can be improved and the printing tolerance can be enhanced by adding or undercoating a compound undergoing a relatively strong interaction with the substrate such as a compound having a diazonium structure or a phosphone compound. On the other hand, the development properties of a non-image part can be improved and stain-proofness can be improved by adding or undercoating a hydrophilic polymer such as polyacrylic acid or polysulfonic acid.

The lithographic printing plate precursor can be produced by dissolving a coating solution for the recording layer and coating solution components for desired layers such as a protective layer in a solvent and coating resultant solutions on an appropriate support to thereby form a lithographic printing plate precursor.

Examples of the solvent to be used herein include acetone methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, prpylene glycol monoethyl ehter, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methxyethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoetyl ether acetate, 3-methoxypropyl acetate, N,N-dimethylformamide, dimethyl sulfoxide, γ-butyrolactone, methyl lactate, ethyl lactate and so on. Either one of these solvents or a mixture thereof may be used. The concentration of the solid matters in the coating solution appropriately ranges from 2 to 50% by mass.

It is desirable to appropriately select the coating dose of the recording layer on the support by considering effects on the sensitivity of the recording layer, the development characteristics, the strength and the printing tolerance of the exposure film etc. In the case where the coating dose is too mall the printing tolerance becomes insufficient. On the other hand, it is also undesirable that the coating dose is too large, since the sensitivity is lowered, a long time is needed for the exposure and, moreover, a prolonged time in needed for the development. It is generally appropriate that the coating dose of the lithographic printing plate precursor according to the invention ranges from about 0.1 to about 10 g/m$^2$, still preferably from 0.5 to 5 g/m$^2$, expressed in the mass after drying.

(Protective Layer)

Because of being usually exposed in the atmosphere, it is preferable that the lithographic printing plate precursor according to the invention further has a protective layer on the above-described recording layer. The protective layer prevents the photosensitive layer (recording layer) from the invasion of low-molecular weight compounds such as oxygen and basic substances which occur in the atmosphere and inhibit the image formation reaction proceeding in the photosensitive layer due to the exposure, thereby enables the exposure in the atmosphere. Accordingly it is required that such a protective layer has a low permeability for the low-molecular weight compounds such as oxygen but a high permeability for light to be used in the exposure, is excellent in the adhesion to the photosensitive layer and can be easily removed in the development step following the exposure.

Concerning such a protective layer, devices have been made as reported in detail in U.S. Pat. No. 3,458,311 and JP-A-55-49729. As materials usable in the protective layer, it in favorable to employ, for example, water-soluble polymer compounds having relatively high crystallinity. More specifically speaking, there have been known water-soluble polymers such as polyvinyl alcohol, polyvinylpyrrolidone, acidic celluloses, gelatin, gum arabic and polyacrylic acid. Among these polymers, the most desirable results in fundamental properties (oxygen-blocking, removal in development, etc.) can be obtained by using polyvinyl alcohol as the main component. The polyvinyl alcohol to be used in the protective layer may be partly substituted by an ester, an ether or acetal, so long as it carries unsubstituted vinyl alcohol units for achieving the required oxygen-blocking properties and solubility in water. Similarly, it my partly have another comonomer.

Specific examples of the polyvinyl alcohol include those which are hydrolyzed to an extent of 71 to 100% and have a molecular weight of from 300 to 2400. More specifically speaking, use can be made of PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8, etc. each manufactured by KURARAY.

The components (the type of PVA, use of additive(s)), application dose, etc. of the protective layer are selected by taking the oxygen-blocking properties and development removal as well as fogging, adhesiveness and scuff resistance into consideration.

In general, a higher hydrolysis ratio of the employed PVA (i.e., the higher content of the unsubstituted vinyl alcohol units in the protective layer) brings about the higher oxygen-blocking properties, which is advantageous from the viewpoint of sensitivity. When the oxygen-blocking properties are extremely elevated, however, there arise same problems such as the occurrence of an unnecessary polymerization during production or storage and unnecessary fogging or line thickening during exposure of the image. In addition, the adhesiveness to the image part and the scuff resistance are highly important factors in handling. That is to say, when a hydrophilic layer made of a water-soluble polymer is laminated upon a lipophilic polymerization layer, the insufficient adhesive force frequently causes film separation and the separated part induces troubles such as film hardening failure due to the inhibition of the polymerization by oxygen.

To overcome this problem, various proposals have been made to improve the pressure-sensitive adhesion between these two layers. For example, U.S. Pat. No. 292,501 and U.S. Pat. No. 44,563 report that a sufficient pressure-sensitive adhesion can be achieved by mixing a hydrophilic polymer mainly comprising polyvinyl alcohol with 20 to 60% by mass of an acrylic emulsion, a water-insoluble vinylpyrrolidone/vinyl acetate copolymer, etc. and laminating on the polymerization layer. Any of these publicly known techniques are applicable to the protective layer in the invention. Methods of coating the protective layer are described in, for example, U.S. Pat. No. 3,458,311 and JP-A-55-49729.

Furthermore, an additional function can be imparted to the protective layer. For example, the safelight suitability can be further elevated without lowering the sensitivity by adding a coloring matter (a water-soluble dye, etc.) which is excellent in the permeability of a ray having the wavelength to be used in the exposure and can efficiently absorb rays of wavelengths not contributing to the image formation.

As the protective layer in the lithographic printing plate precursor according to the invention, use can be preferably made of a protective layer having an oxygen permeability of $1 \times 10^{-15}$ {cm$^3$(STP)·cm/cm$^2$·sec·cmHg} or more reported by JP-A-2000-347398.

(Intermediate Resin Layer)

If necessary, the lithographic printing plate precursor according to the invention may have an intermediate resin layer made of an alkali-soluble polymer between the recording layer and the support. Since the recording layer which is an infrared-photosensitive layer showing a decrease in solubility in an alkali developing solution due to exposure is provided on the exposure face or around it, a favorable sensitivity to infrared laser can be achieved. Moreover, the intermediate resin layer, which is located between the support and the infrared-sensitive recording layer, serves as a heat insulating layer. Thus, the heat generated by the exposure to the infrared laser is not diffused in the support but can be effectively utilized, thereby enabling the improvement in the sensitivity.

In the exposed part, the photosensitive layer (the recording layer), which becomes impermeable to the alkali developing solution, serves as a protective layer for the intermediate resin layer. As a result, the development stability is highly improved and an image excellent in discrimination can be formed. At the same time, it is expected that a high stability with the passage of time is also ensured. In the unexposed part, the unhardened binder component is quickly dissolved and dispersed in the developing solution. Since the intermediate resin layer formed adjacent to the support is made of the alkali-soluble polymer, it is highly soluble in the developing solution. Even in the case of using a developing solution having a lowered activity, therefore, it is quickly dissolved therein without giving any film residue. It is therefore considered that excellent development characteristics can be thus established.

(Support)

The support to be used in the lithographic printing plate precursor according to the invention is not particularly restricted, so long as it is a sheet type material having a high dimensional stability. Examples thereof include papers, papers having plastics (for example, polyethylene, polypropylene, polystyrene, etc.) laminated thereon, metal sheets (for example, aluminum, zinc, copper, etc.), plastic films (for example, cellulose biacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.) and so on. Such a support may be a sheet made of a single component such as a resin film or a metal sheet. Alternatively, it may be a laminate made of two or more materials. For example, papers are plastic films having the above metals laminated or evaporated thereon and laminate sheets composed of plastic films of different types fall within the category thereof.

As the above-described support, polyester films and aluminum sheets are preferable. In particular, aluminum sheets are preferable because of being excellent in dimensional stability and relatively less expensive. Appropriate examples of the aluminum sheets are pure aluminum sheets and alloy sheets comprising aluminum as the main component together with a different element in a trace amount. Moreover, it is also possible to use a plastic film having aluminum laminated or evaporated thereon. Examples of the different element contained in the aluminum alloys include silicon, iron, manganese, copper, magnesium, chromium, zinc, bismuth, nickel, titanium and so on. The content of such a different element in an alloy is 10% by weight at the largest. Although pure aluminum is appropriate as the aluminum to be used in the invention, completely pure aluminum can be hardly produced from the viewpoint of refining techniques. Thus, use may be made of one containing a small amount of a different element. That is to say, the aluminum sheet to be applied in the invention is not restricted in its composition but aluminum sheets having been publicly known and used can be appropriately employed.

The thickness of the above-described aluminum sheet ranges from about 0.1 to 0.6 mm, preferably from 0.15 to 0.4 mm and particularly preferably from 0.2 to 0.3 mm.

Before roughening the surface of the aluminum sheet, a degreasing treatment is carried out to remove a rolling-mill oil from the surface with the use of, for example, a surfactant, an organic solvent or an aqueous alkali solution.

The treatment for roughening the aluminum sheet surface can be carried out by various methods, for example, a mechanical roughening method, an electrochemical surface roughening method and a method of chemically solubilizing the surface selectively. As the mechanical roughening method, use can be made of publicly known methods such as the ball grinding method, the brush grinding method, the blast grinding method and the buff grinding method. As the electrochemical surface roughening method, use may be made of a roughening method which is carried out in a hydrochloric acid or nitric acid electrolytic solution under an alternating current or a direct current. It is also possible to use a combination of these methods as disclosed in JP-A-54-63902.

If desired, the thus surface-roughened aluminum sheet may be further subjected to alkali etching and neutralization followed by anodic oxidation to improve the water retention properties and the abrasion resistance of the surface. As the electrolyte to be employed in the anodic oxidation of the aluminum sheet, use may be made of various electrolytes foaming a porous oxidation film. In general, sulfuric acid, phosphoric acid, oxalic acid, chromic acid or a mixture of these acids is used. The concentration of such an electrolyte may be appropriately determined depending on the type of the electrolyte.

The treatment conditions for the anodic oxidation cannot be determined in general since they vary depending on the electrolyte employed. In general, it is appropriate that the concentration of the electrolyte solution ranges from 1 to 80% by mass, the solution temperature ranges from 5 to 70° C., the current density ranges from 5 to 60 A/dm$^2$, the voltage ranges from 1 to 100 V and the electrolysis time ranges from 10 see to 5 min.

It is appropriate that the amount of the anodic oxidation film is 1.0 g/m$^2$ or more, still preferably from 2.0 to 6.0 g/m$^2$. In the case where the amount of the anodic oxidation film is less than 1.0 g/m$^2$, only insufficient printing tolerance is obtained or scuffs are frequently formed on the non-image part of the lithographic printing plate and thus so-canceled "scuff-soiling" (i.e., an ink adheres to scuffs during printing) frequently occurs.

Although the anodic oxidation treatment is carried out on the face to be used in the printing of the support of the lithographic printing plate, it is a common practice to form an anodic oxidation film of 0.01 to 3 g/m$^2$ on the opposite face too by the back turn of electric flux lines.

After the above-described anodic oxidation treatment, the surface of the support is subjected to hydrophilization by using a conventionally known method. The hydrophilization may be carried out by the method with the use of an alkali metal silicate (for example, an aqueous sodium silicate solution) as disclosed by U.S. Pat. No. 2,714,066, U.S. Pat. No. 3,181,461, U.S. Pat. No. 3,280,734 and U.S. Pat. No. 3,902,734. In this method, the support is soaked in an aqueous sodium silicate solution or electrolyzed. Alternatively, use may be made of the method of treating with potassium fluorozirconate as disclosed by JP-B-36-22063 or the method of treating with polyvinylphosphonic acid as disclosed by U.S. Pat. No. 3,276,868, U.S. Pat. No. 4,153,461 and U.S. Pat. No. 4,689,272.

Among these methods, it is particularly preferable in the invention to hydrophilize with the use of a silicate. Nest, the silicate treatment will be illustrated.

The anodic oxidation film of the aluminum sheet having been treated as described above is soaked in an aqueous solution, which contains from 0.1 to 30% by mass (preferably from 0.5 to 10% by mass) of an alkali metal silicate and has a pH value of 10 to 13 at 25° C., at 15 to 80° C. for 0.5 to 120 sec. When the pH value of the aqueous alkali metal silicate solution is lower than 10, the solution would set to gel. When the pH value thereof is higher than 13.0, the anodic oxidation film is dissolved. As the alkali metal silicate to be employed in the invention, use may be made of sodium silicate, potassium silicate, lithium silicate and the like. Examples of a hydroxide to be used for elevating the pH value of the aqueous alkali metal silicate solution include sodium hydroxide, potassium hydroxide, lithium hydroxide and so on. The treatment solution as described above may further contain an alkaline earth metal salt or a group IVB metal salt. Examples of the alkaline earth metal salt include water-soluble salts, e.g., nitrates such as calcium nitrate, strontium nitrate, magnesium nitrate and bariumnitrate, sulfates, hydrochlorides, phosphates acetates, oxalates and borates. Examples of the group IVB metal salt include titanium tetrachloride, titanium trichloride, titanium potassium fluoride, titanium potassium oxalate, titanium sulfate, titanium tetraiodide, zirconium chloride oxide, zirconium dioxide, zirconium oxychloride, zirconium tetrachloride and so on. Zither one of these alkaline earth metal salts and group IVB metal salts or a combination of two or more thereof may be used. Such a metal salt is used preferably in an amount of from 0.01 to 10% by mass, still preferably from 0.05 to 5.0% by mass.

By the silicate treatment, the hydrophilic nature of the aluminum sheet surface is further improved. As a result, an ink hardly adheres to the non-image part during printing and thus the stain-proof performance is improved.

On the back face of the support, a back coat is formed if necessary. As the back coat, it is preferable to use coating layers made of an organic polymer compound described in JP-A-5-45885 or a metal oxide obtained by hydrolyzing and polycondensing an organic or inorganic metal compound described in JP-A-6-35174.

Among these coating layers, a coating layer made of metal oxide obtained from a silicon alkoxy compound such as $Si(OCH_3)_4$, $Si(OC_2H_5)_4$, $Si(OC_3H_7)_4$ or $Si(OC_4H_9)_4$ is particularly preferable, since such a material is easily available at a low cost and the coating layer is excellent in development tolerance.

(Exposure)

The lithographic printing plate precursor according to the invention can be constructed as described above.

In the polymerizable composition according to the invention or the lithographic printing plate precursor according to the invention with the use of the same, an image is formed by exposure. In the case of the lithographic printing plate precursor, the development treatment as will be hereinafter follows the exposure.

As the beams to be used in the exposure, publicly known ones can be employed without restriction. A desirable light source is one having a wavelength of from 300 nm to 1200 nm. More specifically speaking, various lasers can be appropriately used as the light source. Among all, it is appropriate to employ an infrared laser having a wavelength of form 780 nm to 1200 nm.

As the exposure mechanism, any of the inner drum system, the outer drum system, the flat bed system and so on may be employed.

As other exposure light sources, use can be made of ultra-high pressure, high pressure, medium pressure and low pressure mercury lamps, chemical lamps, carbon arc lamps, xenon lamps, metal halide lamps, various laser lamps of the visible and ultraviolet types, fluorescent lamps, tungsten lamps, solar light, etc. Namely, examples thereof include mercury lamps of infrared laser ultrahigh pressure, high pressure, medium pressure and low pressure, chemical lamps, carbon arc lamps, xenon lamps, metal halide lamps, various laser lamps of the visible and ultraviolet types, fluorescent lamps, tungsten lamps, solar light, etc. as will be illustrated hereinafter.

In the case of using the above-described infrared laser in the exposure of the polymerizable composition or the lithographic printing plate precursor according to the invention, it is advantageous from the viewpoint of sensitivity that the component (D) sensitive to the infrared wavelength range is contained therein.

As specific examples of the infrared lasers, a solid laser and a semiconductor laser radiating infrared rays of 760 nm to 1200 nm in wavelength are preferable. Namely, an image can be exposed thereby.

In the invention, the development treatment may be performed immediately after the laser irradiation. Alternatively, a heating treatment may be carried out between the laser irradiation step and the development step. It is preferable that the heating treatment is carried out at 80° C. to 150° C. for 10 sec to 5 min. Owing to this heating treatment, the laser energy required in the laser irradiation and recording can be lessened.

(Development)

The lithographic printing plate precursor according to the invention is usually image-exposed with an infrared laser and then developed preferably with water or an alkaline aqueous solution.

In the invention, the development treatment may be performed immediately after the laser irradiation. Alternatively, a heating treatment may be carried out between the laser irradiation step and the development step. It is preferable that the heating treatment is carried out at 80° C. to 150° C. for 10 sec to 5 min. Owing to this heating treatment, the laser energy required in the laser irradiation and recording can be lessened.

As the developing solution, an alkaline aqueous solution is preferable. The pH value thereof preferably ranges from 10.5 to 12.5. It is still preferable to carry out the development with the use of an alkaline aqueous solution having a pH value of from 11.0 to 12.5. When an alkaline aqueous solution having a pH value less than 10.5 is employed, the non-image part is liable to be soiled. When the development is carried out with an alkaline aqueous solution having a pH value exceeding 12.5, it is feared that the strength of the image part is lowered.

In the case of using an alkaline aqueous solution as the developing solution, a publicly known aqueous alkali solution can be used as a developing solution and an auxiliary solution for the lithographic printing plate precursor according to the invention. Examples thereof include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide. Also, use can be made of organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, thyleneimine, ethylenediamine and pyridine.

Either one of these alkali agents or a combination of two or more thereof may be used.

In the case of developing with the use of an automatic developing machine, it is known that a large amount of lithographic printing plate precursors can be processed over a long period of time without exchanging the developing solution in the development tank by adding the same solution as the development solution or an aqueous solution (an auxiliary solution) having a higher alkali strength than the developing solution to the developing solution. This auxiliary method is preferably usable in the invention too.

To accelerate or regulate the development characteristics, facilitate the dispersion of development residues and enhance the compatibility of the image part of the printing plate with an ink, various surfactants, organic solvents, etc. can be added to the developing solution and the auxiliary solution, if necessary.

It is preferable to add from 1 to 20% by mass, still preferably from 3 to 10% by mass, of a surfactant to the developing solution. When the content of the surfactant is less than 1% by mass, satisfactory effect of improving the development characteristics can be hardly obtained. When a surfactant is added in an amount exceeding 20% by mass, on the other hand, there frequently arise some problems such as a decrease in the strength (abrasion resistance, etc.) of the image.

Preferable examples of the surfactant include anion type, cation type, nonion type and amphoteric type surfactants. More specifically speaking, use can be made of, for example, sodium salt of lauryl alcohol sulfate, ammonium salt of lauryl alcohol sulfate, sodium salt of octyl alcohol sulfate, alkylarylsulfonic acid salts such as sodium salt of isopropylnaphthalenesulfonic acid, sodium salt of isopropylnaphthalenesulfonic acid, sodium salt of polyoxyethylene glycol mononaphthylethyl sulfuric acid ester, sodium salt of dodecylbenzenesulfonic acid and sodium salt of meta-nitrobenzenesulfonic acid, sulfuric acid esters of higher alcohols having 8 to 22 carbon atoms such as secondary sodium alkylsulfates, aliphatic alcohol phosphoric acid ester salts such as sodium salt of cetyl alcohol phosphoric acid ester, sulfonic acid salts of alkylamides such as $C_{17}H_{33}CON(CH_3)CH_2CH_2SO_3Na$, sulfonic acid salts of dibasic aliphatic esters such as sodium sulfosuccinic acid dioctyl ester and sodium sulfosuccinic acid dihexyl ester, ammonium salts such as lauryltrimethylammonium chloride and lauryltrimethylammonium methosulfate, amine salts such as stearamideethyl diethylamine acetic acid salt, polyhydric alcohols such as glycerol fatty acid monoesters and pentaerythritol fatty acid monoesters and polyethylene glycol ethyls such as polyethylene glycol mononaphthyl ethyl and polyethylene glycol mono(nonylphenol)ethyl.

As preferable examples of the organic solvent, those having a solubility in water of about 10% by mass or less are cited. It is still preferable to select an organic solvent from those having a solubility in water of about 5% by mass or less. For example, use can be made of 1-phenylethanol, 2-phenylethanol, 2-phenylpropanol, 1,4-phenylbutanol, 2,2-phenylbutanol, 1,2-phenoxethanol, 2-benzyloxyethanol, o-methoxybenzyl alcohol, m-methoxybenzyl alcohol, p-methoxybenzyl alcohol, benzyl alcohol, cyclohexanol, 2-methylcyolohexanol, 4-methylcyclohexanol, 3-methylcyclohexanol and so on. It is appropriate that the content of the organic solvent ranges from 1 to 5% by mass based on the total mass of the developing solution in using. The amount of the organic solvent closely relates to the amount of the surfactant. Namely, it is favorable to increase the amount of the surfactant with an increase in the amount of the organic solvent. This is because a large amount of the organic solvent cannot be dissolved in the case of using the surfactant only in a small amount and thus favorable developing characteristics cannot be ensured.

Moreover, the developing solution and the auxiliary solution may contain other additives such as an antifoamer and a hard water softener. Examples of the hard water softener include polyphosphoric acid salts such as $N_2P_2O_7$, $Na_5P_3O_3$, $Na_3P_3O_3$, $Na_2O_4P(NaO_3P)PO_3Na_2$ and calgon (sodium polymetaphosphate), aminopolycarboxylic acids such as ethylenediaminetetraacetic acid, its potassium salt and its sodium salt; diethylenetriaminepentaacetic acid, its potassium salt and its sodium salt; triethylenetetraminehexaacetic acid, its potassium salt and its sodium salt; hydroxyethylethylenediaminetriacetic acid, its potassium salt and its sodium salt; nitrilotriacetic acid, its potassium salt and its sodium salt; 1,2-diaminocyclohexanetetraacetic acid, its potassium salt and its sodium salt, 1,3-diamino-2-propanoltetraacetic acid, its potassium salt and its sodium salt, and organic phosphonic acids such as 2-phosphonobutanetricarboxylic acid-1,2,4, its potassium salt and its sodium salt; 2-phosphonobutanetricarboxylic acid-2,3,4, its potassium salt and its sodium salt; 1-phosphonoethanetricarboxylic acid-1,2,2, its potassium salt and its sodium salt; 1-hydroxyethane-1,1-diphosphonic acid, its potassium salt and its sodium salt; and aminotri(methylenephosphonic acid), its potassium salt and its sodium salt. The optimum amount of such a hard water softener varies depending on the hardness of the hard water employed and the amount of the same. In general, it may be added to the developing solution in an amount of from 0.01 to 5% by mass, still preferably from 0.01 to 0.5% by mass.

In the case of developing the lithographic printing plat with the us of an automatic developing machine, the developing solution fatigues as the processing proceeds. Therefore, the processing performance may be restored by using an auxiliary solution or a fresh developing solution. In this case, the replenishment is carried out preferably by the method described in U.S. Pat. No. 4,882,246.

Examples of the developing solution containing a surfactant, an organic solvent, a reducing agent, etc. as described above include a developing solution composition comprising benzyl alcohol, an anionic surfactant, an alkali agent and water as described in JP-A-51-77401, a developing solution composition comprising an aqueous solution containing benzyl alcohol, an anionic surfactant and a water-soluble sulfite as described in JP-A-53-44202, a developing solution composition comprising an organic solvent having a solubility in water at ordinary temperature of 10% by mass or less, an alkali agent and water as described in JP-A-55-155355, etc. These developing solutions are appropriately usable in the invention too.

After developed by using the above-described developing solution and auxiliary solution, the printing plate is post-treated with washing water, a rinsing solution containing a surfactant etc. and a grease desensitization solution containing gum arabic and a starch derivative. In the case of using the image recording material according to the invention as a printing plate precursor, the post-treatment can be carried out by combining these procedures.

In recent years, automatic developing machines for printing plates have been widely employed in the fields of plate making and printing to rationalize and standardize the plate making operations. Such an automatic developing machine, which usually consists of a developing part and a post-treatment part, has a unit transporting a printing plate material, tanks for respective treating solutions and a spraying unit. An exposed printing plate is horizontally transported while respective treating solutions are pumped and sprayed thereto from spray nozzles, thereby effecting the development. Recently, there is also known a process wherein a printing plate precursor is transported and treated in the state of being soaked in a treating solution tank filled up with a treating solution with the use of a submerged guide roll or the like. In such an automatic process, an auxiliary solution can be added to each treating solution depending on the treatment amount and the operation time. It is also possible to automatically replenish a treating solution by detecting the electrical conductivity with a sensor.

Moreover, use can be made of a so-called disposable treating process wherein the treatment is carried out by using a substantially unused treating solution.

The lithographic printing plate thus obtained is coated with a grease desensitization gum, if desired, and then subjected to the printing step. In the case where a lithographic printing plate having an enhanced printing tolerance is required, it is subjected to burning.

In the case of subjecting the lithographic printing plate to burning, it is preferable to treat the printing plate with a face-controlling solution described in JP-B-61-2518, JP-B-55-28062, JP-A-62-31859 and JP-A-61-169655 before burning.

The treatment may be carried out by, for example, putting the face-controlling solution on a sponge or an absorbent cotton and coating on the lithographic printing plate, soaking the printing plate in a vat filled up with the face-controlling solution for coating, or by using an automatic coater. Still preferable results can be obtained by uniforming the coating dose with a squeezer or a squeezer roller after the completion of the coating.

After the burning treatment, the lithographic printing plate is optionally subjected to the treatments commonly employed in the art, for example, washing with water and degumming. In the case of using a face-controlling agent containing a water-soluble polymer compound etc., so-called grease-desensitization treatments such as degumming can be omitted.

The lithographic printing plate thus obtained can be used in multisheet printing by using an offset printer etc.

EXAMPLES

Next, the invention will be illustrated in greater detail by reference to the following Examples. However, it is to be understood that the invention is not construed as being restricted thereto.

Examples 1 to 12

[Construction of Substrate]

An aluminum sheet (material 1050) having a thickness of 0.3 mm was washed with trichloroethylene and degreased. Next, the surface of the sheet was etched by sandblasting with the use of a nylon brush and an aqueous suspension of 400-mesh Pumice. After washing with water, it was soaked in 20% nitric acid for 20 sec and washed with water. The etching dose of the sandblasted surface was about 3 $g/m^2$.

Subsequently, a direct current electrode oxidation film of 3 $g/m^2$ was formed on this sheet at a current density of 15 $A/dm^2$ with the use of 7% sulfuric acid as an electrolyte followed by washing with water and drying, thereby giving a substrate (A).

The substrate (A) was treated with a 2% by weight aqueous solution of sodium silicate at 25° C. for 15 sec and washed with water to give another substrate (B).

[Formation of Intermediate Layer]

Next, a liquid composition (a sol) for the SG method was prepared in the following manner.

| <Sol composition> | |
|---|---|
| methanol | 130 g |
| water | 20 g |
| 85% by weight phosphoric acid | 16 g |
| tetraethoxysilane | 50 g |
| 3-methacryloxypropyltrimethoxysilane | 60 g |

The above compounds were mixed together and stirred. Heat generation was observed within about 5 minutes. After reacting for 60 min, the contents were transferred into another container and 3000 g of methanol was added thereto to give a sol.

This sol was diluted with methanol/ethylene glycol=9/1 (by weight) and coated on the substrate [A] constructed above in such a manner as to give 3 $mg/m^2$ of Si on the substrate. After drying at 100° C. for 1 min, a substrate [C] was obtained.

[Formation of Photosensitive Layer (Recording Layer)]

Using the substrate [A] or the substrate [α] constructed above as a support, a coating solution for photosensitive layer of the following composition was coated on the surface and dried at 120° C. for 1 min to form a photosensitive layer of 1.35 $g/m^2$. Thus, lithographic printing plate precursors of Examples 1 to 12 were obtained. Table 1 shows the substrates employed, (D) compounds having an absorption maximum at 700 to 1200 nm (indicated as infrared absorber in Table 1), (B) compounds having a polymerizable unsaturated group (indicated as polymerizable compound in Table 1), (C) radical generators containing a specific compound (indicated as polymerization initiator in Table 1), and (A) binders.

| (Coating solution for photosensitive layer) | |
|---|---|
| (D) compound having absorption maximum at 700 to 1200 nm (compound listed in Table 1) | 0.075 g |
| polymerization initiator (compound listed in Table 1) | 0.180 g |
| (A) binder (compound listed in Table 1) | 1.10 g |
| (B) polymerizable compound (compound listed in Table 1) | 1.00 g |
| fluorine-type nonionic surfactant (Megafac F-177P, manufactured by Dainippon Ink and Chemicals Inc.) | 0.025 g |
| Ethyl violet (manufactured by Aldrich) | 0.04 g |
| cyclohexanone | 10 g |
| methan 1 | 7 g |
| 1-methoxy-2-propanol | 8 g |

TABLE 1

| | Substrate | Polymerization initiator (Hammet's value) | Infrared absorber | Polymeriable compound | Binder | Developing solution | Sensitivity (rpm) | | Sensitivity (rpm) | Change in density |
|---|---|---|---|---|---|---|---|---|---|---|
| Ex. 1 | A | A-4(1.02) | DX-1 | M-2 | B-1 | DV-2 | 140 | Ex. 15 | 140 | 2% |
| Ex. 2 | A | B-1(0.69) | DX-1 | M-1 | B-1 | DV-2 | 145 | Ex. 16 | 145 | 2% |
| Ex. 3 | B | D-8(0.66) | DX-2 | M-2 | B-1 | DV-2 | 135 | Ex. 17 | 130 | 2% |
| Ex. 4 | A | D-4 (0.66) | DX-2 | M-2 | B-2 | DP-4 | 135 | Ex. 18 | 130 | 2% |
| Ex. 5 | B | E-6(0.63) | DX-3 | M-1 | B-2 | DV-2 | 130 | Ex. 19 | 125 | 2% |
| Ex. 6 | C | F-4(1.48) | DX-1 | M-2 | B-1 | DP-4 | 140 | Ex. 20 | 145 | 2% |
| Ex. 7 | A | G-1(1.29) | DX-1 | M-1 | B-1 | DV-2 | 145 | Ex. 21 | 150 | 2% |
| Ex. 8 | B | N-2(0.52) | DX-2 | M-1 | B-2 | DV-2 | 125 | Ex. 22 | 120 | 2% |
| Ex. 9 | C | N-3(0.57) | DX-3 | M-2 | B-2 | DP-4 | 125 | Ex. 23 | 125 | 2% |
| Ex. 10 | C | B-5(0.69) | DX-1 | M-2 | B-1 | DP-4 | 145 | Ex. 24 | 150 | 2% |
| Ex. 11 | A | P-5(0.65) | DX-1 | M-1 | B-1 | DV-2 | 145 | Ex. 25 | 150 | 2% or less |

TABLE 1-continued

| | Substrate | Polymerization initiator (Hammet's value) | Infrared absorber | Polymeriable compound | Binder | Developing solution | Sensitivity (rpm) | | Sensitivity (rpm) | Change in density |
|---|---|---|---|---|---|---|---|---|---|---|
| Ex. 12 | A | P-7(0.52) | DX-1 | M-1 | B-1 | DV-2 | 120 | Ex.26 | 125 | 2% or less |
| Ex. 13 | A | A-4(1.02) | DX-1 | M-1 | B-3 | DV-2 | 135 | Ex. 27 | 135 | 3% |
| Ex. 14 | A | B-1(0.69) | DX-1 | M-1 | B-3 | DV-2 | 145 | Ex. 28 | 145 | 3% |
| Ex. 29 | A | B-20 | DX-1 | M-3 | B-4 | DV-2 | 150 | Ex. 32 | 155 | 2% or less |
| Ex. 30 | A | B-17 | DX-1 | M-3 | B-4 | Dv-2 | 150 | Ex. 33 | 155 | 2% or less |
| Ex. 31 | A | B-20 | DX-1 | M-3 | B-4 | DV-2 | 145 | Ex. 34 | 150 | 2% or less |
| C.Ex. 1 | A | HA(−0.81) | DX-1 | M-1 | B-1 | DV-2 | 95 | C.Ex. 3 | 95 | 6% |
| C.Ex. 2 | A | HB(0) | DX-2 | M-2 | B-2 | DP-4 | 110 | C.Ex. 4 | 105 | 6% |

The polymerizable compound (M-1) shown in Table 1 as the component (B) is dipentaerythritol haxaacrylate (DPHA: manufactured by Nippon Kayaku) while the polymerizable compound (M-2) is tris(acryloxyethyl)isocyanurate (M-315: manufactured by Toagosei).

The binder polymers (A) [(B-1) to (B-3)] and the compounds having an absorption maximum at 700 to 1200 nm [(DX-1) to (DX-3)] shown as the component (B) in Table 1 have the following structures.

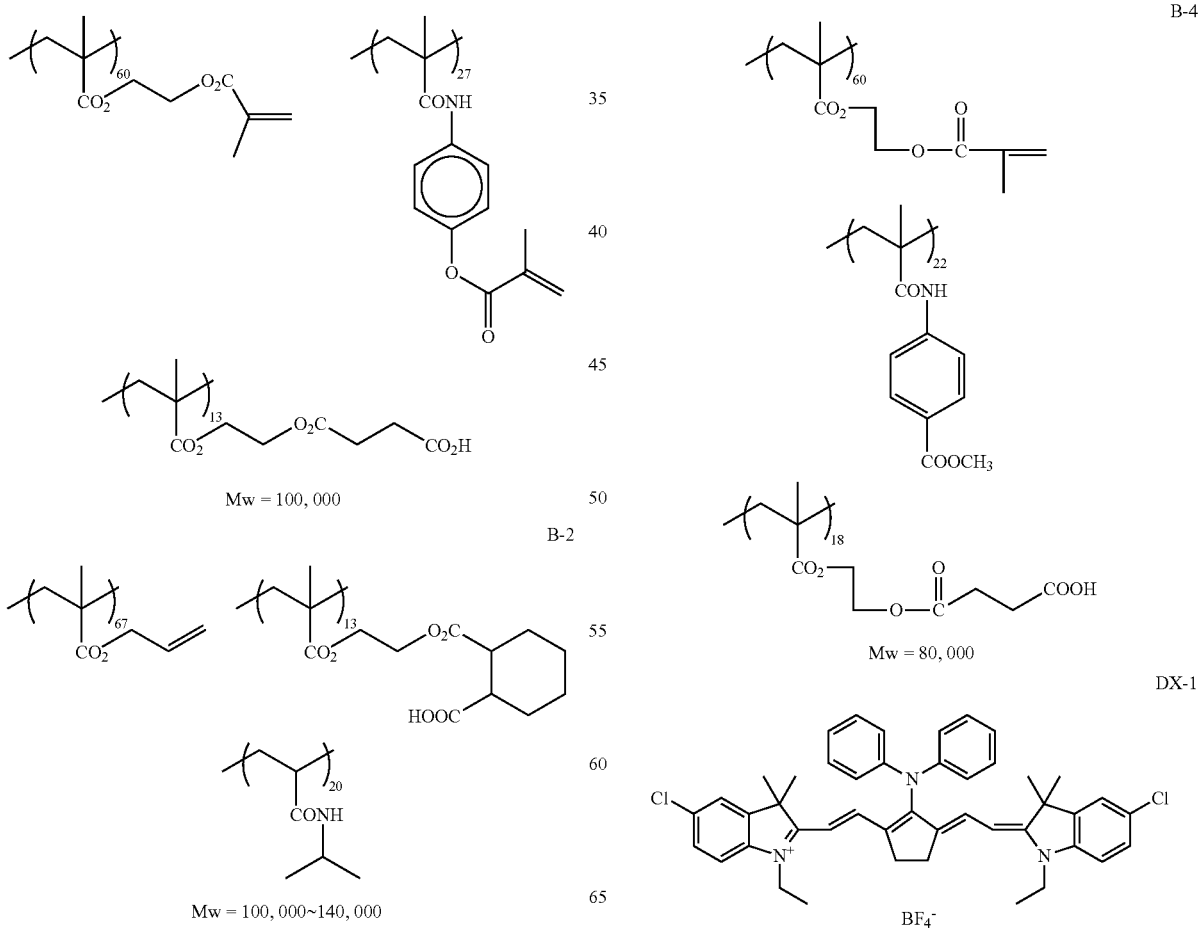

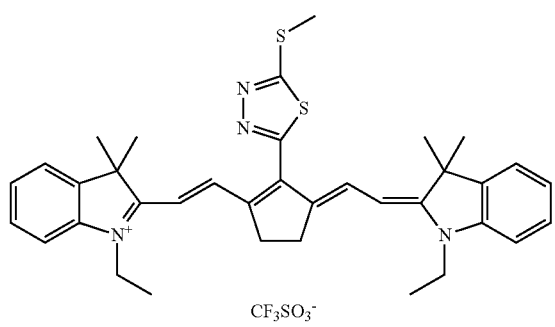

DX-2

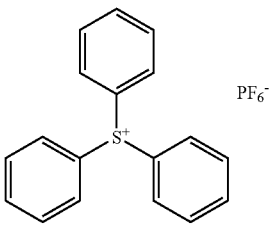

HB

Examples 15 to 28 and Comparative Examples 3 and 4

On the photosensitive layer of each of the lithographic printing plate precursors obtained in the above Examples 1 to 14 and Comparative Examples 1 and 2, a 3% by mass aqueous solution of polyvinyl alcohol (degree of saponification: 98% by mol, degree of polymerization: 550) was coated to give a coating dose of 2 g/m$^2$ after drying and dried at 100° C. for 1 sec to form a protective layer on the photosensitive layer. Thus, lithographic printing plate precursors of Examples 15 to 28 and Comparative Examples 3 and 4 were obtained.

[Evaluation of Lithographic Printing Plate Precursor]
—Evaluation of Sensitivity—

The obtained lithographic printing plate precursors of Examples 1 to 14 and Comparative Examples 1 and 2 were exposed by using a Trendsetter 3244VX (manufactured by Creo) equipped with a water-cooled 40 W infrared semiconductor laser at an energy output of 6 W while changing the plate energy by controlling the rotation number of the outer drum. After developing under the following conditions, the rotation number of the drum at which a clear solid image could be obtained was measured and referred to as the sensitivity. The lithographic printing plate precursors of examples 15 to 28 and Comparative Examples 3 and 4, each having an overcoat layer on the surface of the recording layer, were evaluated in the same manner but at an energy output of 4 W. A lithographic printing plate precursor having a larger rotation number allows recording at the higher speed and, therefore, is evaluated as excellent in sensitivity.

—Development Treatment—

After the exposure, the development treatment was carried out with the use of an automatic developing machine Stablon 900N (manufactured by Fuji Photo Film). As the developing solution, use was made of DV-2 (manufactured by Fuji Photo Film) diluted with water at 1:4, or use was made of DP-4 (manufactured by Fuji Photo Film) diluted with water at 1:8. The temperature of the developing bath was 30° C. As the finisher, use was made of FN-6 (manufactured by Fuji Photo Film) diluted with water at 1:1.

—Test on Prevention of Damage Due to Developing Solution—

The lithographic printing plate precursors of Examples 15 to 28 and Comparative Examples 3 and 4 were exposed by using the same exposure apparatus as employed in the evaluation of sensitivity at an energy output of 4 W and at a rotational number of the outer drum of 120 rpm. Then the exposed plates were soaked for 1 min in the same developing solutions as those employed in the cases of the corresponding Examples 1 to 14 and Comparative Examples 1 and 2. Then optical density changes in the image parts compared with those immediately after the exposure were measured based on the cyanine density with a Spectrodensitometer manufactured by X-Rite.

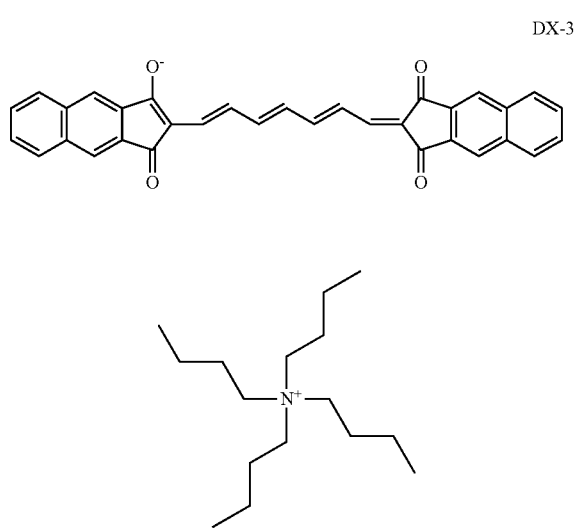

Comparative Examples 1 and 2

Lithographic printing plate precursors of Comparative Examples 1 and 2 were obtained by forming photosensitive layers as in Examples 1 to 14 but using the substrate [A] as the support and employing the binder polymers (A), the polymerization initiators and the compounds having an absorption maximum at 700 to 1200 nm each as listed in Table 1. In these Comparative Examples, the specific compound employed as the polymerization initiator component (C) in the invention was substituted respectively by polymerization initiators HA and HB having the following structures.

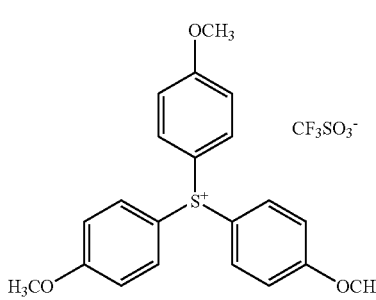

HA

A lithographic printing plate precursor showing a smaller change in density before and after the soaking is evaluated as suffering from less damage in the image region due to the developing solution (i.e., being excellent in the effect of preventing damages).

Table 1 also shows the results.

The results given in Table 1 indicate that the lithographic printing plate precursors of Examples 1 to 28 with the use of the polymerizable compositions according to the invention in the recording layers made it possible to form an image at a high sensitivity and the image parts thereof were hardly damaged by the developing solutions. In the cases of forming protective layers on the photosensitive layers, a similar tendency to those having no protective layer was observed. Comparisons between Examples 1 and 13 and Examples 2 and 14 indicate that in the case of using a polymer having a repeating unit represented by the above formula (I) (for example, 2-methacryloyloxyethyl succinic acid copolymer, 2-methacryloyloxyethyl hexahydrophthalic acid copolymer, etc.) as the binder polymer, the effect of preventing damages by a developing solution could be improved while maintaining a high sensitivity.

On the other hand, it was also found out that the lithographic printing plate precursors of Comparative Examples 1 to 4 were inferior in sensitivity and development tolerance in the image parts to the lithograph printing plate precursors of Examples 2, 4, 16 and 18 which were constructed under the same conditions.

Examples 29 to 31

The coating solution 2 for photosensitive layer of the following composition was coated on the same substrate as used in the for going example 1, and dried at 120° C. for 1 min. In this way, a photosensitive layer in 1.35 g/m² was provided, thus giving a lithographic printing plate precursor.

| (Coating solution 2 for photosensitive layer) | |
|---|---|
| (D) Compound having absorption maximum at 700 to 1200 nm (the compound listed in Table 1) | 0.075 g |
| (C) Polymerization initiator (the compound listed in Table 1) | 0.180 g |
| (A) Binder (the compound listed in Table 1) | 1.10 g |
| (B) Polymerizable compound (the compound listed in Table 1) | 1.00 g |
| Polycarboxylic acid compound (having the structure below) (however, added only in Examples 29 and 30; not added in Example 31) | 0.10 g |
| Fluorine-containing nonionic surfactant (Megafac F-177P, manufactured by Dainippon Ink and Chemicals Inc.) | 0.025 g |
| Dye in which the counter anion of Ethyl Violet is naphthalenesulfonic acid anion | 0.04 g |
| Methyl ethyl ketone | 10 g |
| 1-Methoxy-2-propanol | 8 g |
| Methanol | 7 g |

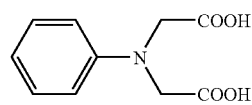

Examples 32 to 34

On the photosensitive layer of each lithographic printing plate precursor prepared in the foregoing ales 29 to 31, a 3% by mass aqueous solution of poly (vinyl alcohol) (degree of saponification: 98 mol %, degree of polymerization; 550) was coated so as to give a coated weight of 2 g/m² after drying. By drying the coating at 100° C. for 1 min, a protective layer was formed on the photosensitive layer, thus providing a lithographic printing plate precursor for Examples 32 to 34.

The resulting lithographic printing plate precursors were evaluated as in Examples 1 to 28. The results and the developers used were shown together in the foregoing Table 1.

As is evident in Table 1, by using, as a preferable embodiment of the invention, a compound having a triarylsulfonium cationic structure containing three halogen atoms and also an organic anion as Component (C), and a polymer having a repeating unit represented by the foregoing formula (I) as Binder (A), a sufficiently high sensitivity and an advantageous effect of suppressing damages caused by development were attained, Further, it is evident that the lithographic printing plate precursor having an image-recording layer incorporated with a polycarboxylic acid compound as a sensitizer is excellent in sensitivity and the effect of suppressing damages caused by development even among Examples. Still further, in the case where a protective coating was formed on the photosensitive layer, the same tendency was observed as in the plate precursors having no protective coating.

According to the invention, a polymerizable composition, which can be hardened at a higher sensitivity with the use of an infrared laser, etc., and a lithographic printing plate precursor with the use of the same, which enables image formation at a high sensitivity and in which damages in the image area due to the development processing can be effectively suppressed, can be provided.

This application is based on Japanese Patent application JP 2002-366539, filed Dec. 18, 2002, and Japanese Patent application JP 2003-202951, filed Jul. 29, 2003 the entire contents of those are hereby incorporated by reference, the same as if set forth at length.

What is claimed is:

1. A lithographic printing plate precursor comprising: a support; and a recording layer,
the recording layer containing:
(A) a binder polymer;
(B) a compound having a polymerizable unsaturated group;
(C) a compound which has a triarylsulfonium salt structure and in which the sum of Hammett's constants of all substituents bonded to the aryl skeleton is larger than 0.50,
wherein the compound (C) has a triarylsulfonium cationic structure containing three or more halogen atoms and has an organic anion selected from the group consisting of a sulfonate anion, a benzoylformate anion, a carboxylate anion, a sulfinate anion, a sulfate anion, a polymeric sulfonate anion and a polymeric carboxylate anion; and
(D) a compound having an absorption maximum at 700 to 1200 nm,
wherein the compound (D) is represented by the following formula (a):

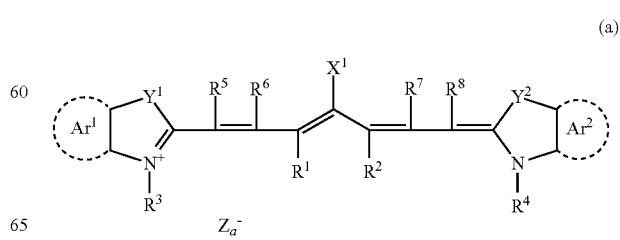

wherein $X^1$ represents a hydrogen atom, a halogen atom, $-NAr^3{}_2$, $X^2$-$L^1$ or the following group (a-1), $X^2$ represents an oxygen atom or a sulfur atom, while $L^1$ represents a hydrocarbon group having 1 to 12 carbon atoms, an aromatic ring having a hetero atom or a hydrocarbon group containing a hetero atom and having 1 to 12 carbon atoms, and $Ar^3$ represents a substituted or unsubstituted aromatic hydrocarbon group having from 6 to 14 carbon atoms; $R^1$ and $R^2$ each independently represents a hydrocarbon group having 1 to 12 carbon atoms; $Ar^1$ and $Ar^2$ each independently represents a substituted or unsubstituted aromatic hydrocarbon group; $Y^1$ and $Y^2$ each independently represents a sulfur atom or a dialkylmethylene group having 12 or less carbon atoms; $R^3$ and $R^4$ each independently represents a substituted or unsubstituted hydrocarbon group having 20 or less carbon atoms; $R^5$, $R^6$, $R^7$ and $R^8$ each independently represents a hydrogen atom or a hydrocarbon group having 12 or less carbon atoms; and $Za^-$ represents a counter anion:

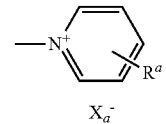

(a-1)

wherein $Xa^-$ represents a counter anion; and $R^a$ represents a hydrogen atom, an alkyl group, an aryl group, a substituted or unsubstituted amino group, or a halogen atom.

2. The lithographic printing plate precursor according to claim 1, wherein the organic anion is a sulfonate anion.

3. The lithographic printing plate precursor according to claim 1, wherein the sum of Hammett's constants of all substituents bonded to the aryl skeleton is larger than 0.60.

* * * * *